US012541151B2

(12) United States Patent
Harayama et al.

(10) Patent No.: US 12,541,151 B2
(45) Date of Patent: Feb. 3, 2026

(54) APPARATUS AND METHOD FOR CONTROLLING SPREAD OF PLURALITY OF DROPLETS OF PHOTO-CURING COMPOSITION

(71) Applicant: CANON KABUSHIKI KAISHA, Tokyo (JP)

(72) Inventors: Tomohiro Harayama, Tochigi (JP); Kiyohito Yamamoto, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 97 days.

(21) Appl. No.: 18/415,742

(22) Filed: Jan. 18, 2024

(65) Prior Publication Data

US 2024/0255853 A1 Aug. 1, 2024

(30) Foreign Application Priority Data

Jan. 31, 2023 (JP) ................................ 2023-013283

(51) Int. Cl.
*G03F 7/16* (2006.01)
*B29C 59/02* (2006.01)
*G03F 7/00* (2006.01)

(52) U.S. Cl.
CPC ............ *G03F 7/168* (2013.01); *B29C 59/026* (2013.01); *G03F 7/0002* (2013.01)

(58) Field of Classification Search
CPC ...... G03F 7/168; G03F 7/0002; B29C 59/026
See application file for complete search history.

(56) References Cited

U.S. PATENT DOCUMENTS 11,651,118 B2 5/2023 Asano et al.
2014/0131313 A1* 5/2014 Wakamatsu .......... G03F 7/0002 703/2
2017/0068159 A1* 3/2017 Khusnatdinov ....... G03F 7/0002
2020/0363716 A1 11/2020 Seki
2020/0394346 A1* 12/2020 Asano .................. G03F 7/0002
2021/0157236 A1* 5/2021 Khusnatdinov ......... G03F 7/095

FOREIGN PATENT DOCUMENTS

JP 2020205413 A 12/2020
KR 1020190069306 A 6/2019
KR 1020200141947 A 12/2020
KR 1020210063230 A 6/2021

OTHER PUBLICATIONS

Office Action issued in Taiwanese Appln. No. 113102521 dated Dec. 4, 2025.

* cited by examiner

*Primary Examiner* — Xiao S Zhao
*Assistant Examiner* — Inja Song
(74) *Attorney, Agent, or Firm* — ROSSI, KIMMS & McDOWELL LLP

(57) ABSTRACT

An information processing method for generating control information for controlling spread of a plurality of droplets of a photo-curing composition arranged between a substrate and a mold, includes generating, as a part of the control information, control data that controls an irradiation condition of light to be irradiated to each of the plurality of droplets such that a shape change of each of the plurality of droplets before droplets adjacent to each other among the plurality of droplets are connected to each other satisfies a target condition.

8 Claims, 27 Drawing Sheets

■ DMD On □ DMD Off

APPARATUS AND METHOD FOR CONTROLLING SPREAD OF PLURALITY OF DROPLETS OF PHOTO-CURING COMPOSITION

BACKGROUND OF THE INVENTION

Field of the Invention

The present invention relates to an apparatus and method for controlling spread of a plurality of droplets of photo-curing composition.

Description of the Related Art

There is a film forming apparatus that arranges a plurality of droplets of a curable composition on a substrate, forms a film of the curable composition by bringing the plurality of droplets and a mold into contact with each other, and cures the film, thereby forming a cured film. An apparatus that forms a pattern as a cured film can be called an imprint apparatus, and an apparatus that forms a planarized film as a cured film can be called a planarization apparatus. It could be said that, to form a cured film having desired quality, emphasis has conventionally been placed on optimizing the arrangement of a plurality of droplets (see Japanese Patent Laid-Open No. 2020-205413). However, a long time is needed to decide or optimize the arrangement of a plurality of droplets to obtain a cured film having desired quality.

SUMMARY OF THE INVENTION

The present invention provides a technique advantageous in more easily obtaining a cured film of desired quality.

One of aspects of the present invention provides an information processing method for generating control information for controlling spread of a plurality of droplets of a photo-curing composition arranged between a substrate and a mold, comprising: generating, as a part of the control information, control data that controls an irradiation condition of light to be irradiated to each of the plurality of droplets such that a shape change of each of the plurality of droplets before droplets adjacent to each other among the plurality of droplets are connected to each other satisfies a target condition.

Further features of the present invention will become apparent from the following description of exemplary embodiments with reference to the attached drawings.

DESCRIPTION OF THE EMBODIMENTS

Figure 1:
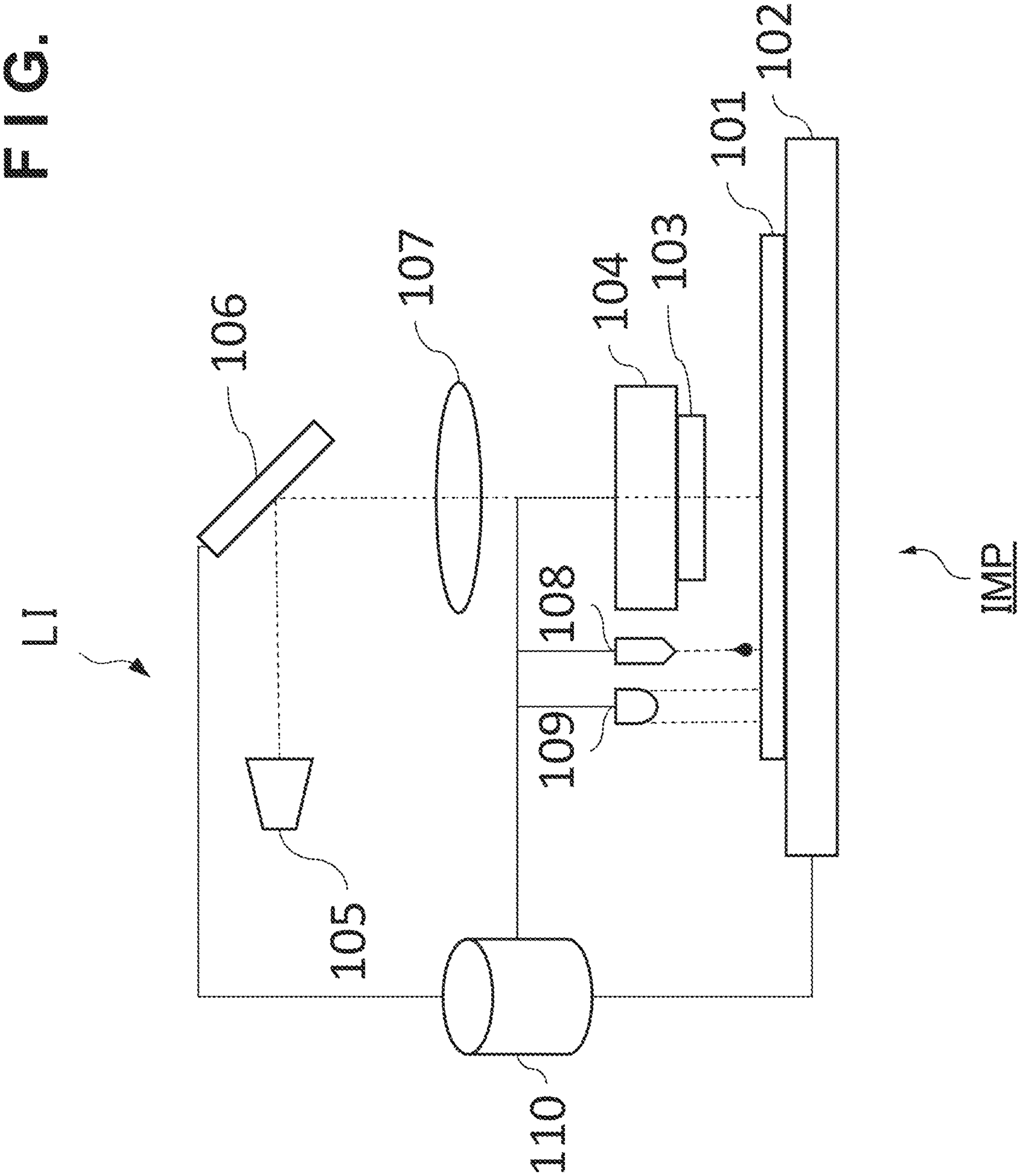
FIG. 1 is a view schematically and exemplarily showing the configuration of a film forming apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

The present invention can be applied to a film forming apparatus and a film forming method for bringing a plurality of droplets of a photo-curing composition arranged on a substrate into contact with a mold and curing a liquid film formed by connection of the plurality of droplets, thereby forming a cured film. A film forming apparatus that forms a pattern as a cured film can be called an imprint apparatus, and a film forming apparatus that forms a planarized film as a cured film can be called a planarization apparatus. In the imprint apparatus, a mold including a pattern to be transferred to a substrate or a cured film can be used as a mold. In the planarization apparatus, a mold (this can be called a superstrate) having a flat surface can be used as a mold.

The photo-curing composition can be a curable composition that is cured by irradiation of light. The wavelength of light can be selected from the range of, for example, 10 nm (inclusive) to 1 mm (inclusive). In another viewpoint, the light can be, for example, infrared rays, a visible light beam, ultraviolet rays, or the like. The photo-curing composition contains at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. The photo-curing composition can be arranged as a plurality of droplets on a substrate. The viscosity (the viscosity at 25° C.) of the photo-curing composition can be, for example, 1 mPa·s (inclusive) to 100 mPa·s (inclusive). As the material of a substrate, for example, glass, ceramic, a metal, a semiconductor (Si, GaN, SiC, or the like), a resin, or the like can be used. A member made of a material different from that of the substrate may be provided on the surface of the substrate, as needed. The substrate is, for example, a silicon wafer, a semiconductor compound wafer, or silica glass.

FIG. 1 shows the configuration of an imprint apparatus IMP that is a film forming apparatus according to an embodiment. The imprint apparatus IMP brings a plurality of droplets of a photo-curing composition arranged on a substrate 101 into contact with a mold 103 and cures a liquid film formed by connection of the plurality of droplets, thereby forming a cured film. The pattern of the mold 103 can thus be transferred to the substrate 101 or the cured film. The imprint apparatus IMP can include a substrate driving mechanism 102 that holds and drives the substrate 101. The imprint apparatus IMP can also include a mold driving mechanism 104 that holds and drives the mold 103. The mold 103 can have a pattern (for example, an electronic circuit pattern) to be transferred to the substrate 101.

The imprint apparatus IMP can include a dispenser 108 that arranges a plurality of droplets of the photo-curing composition on the substrate 101. Note that in this specification, the droplets of the photo-curing composition will sometimes simply be referred to as droplets. The dispenser 108 may not be an essential constituent element of the imprint apparatus IMP, and before the substrate 101 is supplied to the imprint apparatus IMP, a plurality of droplets of the photo-curing composition may be arranged on the substrate 101 by a dispenser arranged outside the imprint apparatus IMP.

The imprint apparatus IMP can include a light irradiator LI that irradiates the plurality of droplets of the photo-curing composition arranged on the substrate 101 or a liquid film of the photo-curing composition with light. The light irradiator LI can include a light source 105 that generates light having a wavelength for curing the photo-curing composition. The light irradiator LI can include an optical modulation device 106 configured to control the irradiation condition of the light to the plurality of droplets of the photo-curing composition arranged on the substrate 101 or the liquid film of the photo-curing composition. The optical modulation device 106 can include, for example, a Digital Micromirror Device (DMD). The optical modulation device 106 is arranged in the optical path between the light source 105 and the mold 103 and modulates the light from the light source 105. The plurality of droplets of the photo-curing composition arranged on the substrate 101 or the liquid film of the photo-curing composition can be irradiated with the light modulated by the optical modulation device 106. The light irradiator LI may include an optical system 107 that adjusts an illuminance distribution. The optical system 107 can be configured to, for example, adjust the focal depth of light irradiated via the optical modulation device 106 to the space between the substrate 101 and the mold 103.

The imprint apparatus IMP can include a controller 110. The controller 110 can be configured to control at least the optical modulation device 106. The controller 110 may be configured to control the light irradiator LI (including the optical modulation device 106), the substrate driving mechanism 102, the mold driving mechanism 104, the dispenser 108, and a camera 109 to be described later. The controller 110 can be formed from, for example, a PLD (an abbreviation for Programmable Logic Device) such as an FPGA (an abbreviation for Field Programmable Gate Array), an ASIC (an abbreviation for Application Specific Integrated Circuit), a general-purpose or dedicated computer installed with a program, or a combination of all or some of these components.

The controller 110 can control the optical modulation device 106 such that the shape change of each of a plurality of droplets before droplets adjacent to each other among the plurality of droplets of the photo-curing composition on the substrate 101 are connected to each other satisfies a target condition. In another viewpoint, the controller 110 can control the optical modulation device 106 such that the shape change of each of a plurality of droplets before droplets adjacent to each other among the plurality of droplets of the photo-curing composition arranged between the substrate 101 and the mold 103 are connected to each other satisfies a target condition. The target condition can be, for example, transition of the shape change of each droplet (for example, a target shape at each of a plurality of times). The target shape of each droplet at each time can be given by, for example, a first target shape and a second target shape. If the first target shape is fitted within the outer shape of the shape of a droplet, and the shape of the droplet is fitted within the outer shape of the second target shape, it can be determined that the shape of the droplet matches the target shape.

The controller 110 can control the light irradiator LI or the optical modulation device 106 based on control information for controlling spread of a plurality of droplets of the photo-curing composition arranged between the substrate 101 and the mold 103. The control information can include control data that controls the irradiation condition of light to each of the plurality of droplets such that the shape change of each of the plurality of droplets before droplets adjacent to each other among the plurality of droplets are connected to each other satisfies a target condition. The control data can include DMD control data that individually controls a plurality of micromirrors (pixels) provided in a DMD serving as the optical modulation device 106. The DMD control data can include data that individually spatially and/or temporally modulates the plurality of micromirrors (pixels). The irradiation condition can include a spatial illuminance distribution of light irradiated to each of the plurality of droplets. Alternatively, the irradiation condition can include an integrated irradiation amount distribution of light irradiated to each of the plurality of droplets. Alternatively, the irradiation condition can include an irradiation period of light to each of the plurality of droplets. To regions in which the plurality of droplets spread, a plurality of pixels (preferably, at least nine pixels) among all pixels of the optical modulation device 106 can be assigned. The controller 110 can have a function of generating control information for controlling the optical modulation device 106.

The imprint apparatus IMP may include the camera 109. The camera 109 can be configured and arranged to observe, for example, the photo-curing composition on the substrate 101. In another viewpoint, the camera 109 can be configured and arranged to observe (the photo-curing composition in) the space between the substrate 101 and the mold 103. In FIG. 1, the camera 109 is arranged on a side of the mold driving mechanism 104. However, the camera 109 can be configured and arranged to observe the photo-curing composition on the substrate 101 through the mold 103. Using the camera 109, the controller 110 can acquire the behavior (for example, spread or shape change of each droplet) of each of the plurality of droplets (that is, each droplet) of the photo-curing composition between the substrate 101 and the mold 103. Also, using the camera 109, the controller 110 can acquire the relationship between DMD control data (input) and the behavior of each droplet (output).

Some examples will be described below.

Example 1

In Example 1, a DMD is used as an optical modulation device 106. The number of micromirrors (pixels) of the DMD can arbitrarily be decided, and an example in which the number of pixels in the horizontal direction is 1,250, and the number of pixels in the vertical direction is 1,500 will be described here. An imprint region (shot region) in which a film is formed by one imprint operation can also have an arbitrary size, and an example in which the region has a size of 25 mm in the horizontal direction and 30 mm in the vertical direction will be described here. Under this condition, the illuminance of light, the irradiation timing, and the irradiation period can be controlled by the DMD for each 25-μm square (vertical direction=25 μm, horizontal direction=25 μm) section (each irradiation position) of the imprint region.

Figure 2:
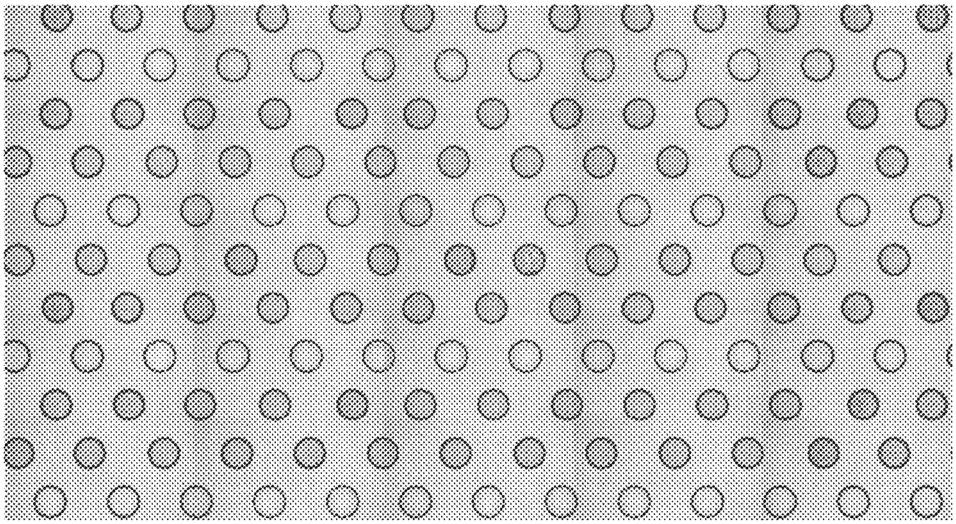
FIG. 2 is a view exemplarily showing an image obtained by capturing, by a camera, a plurality of droplets of a curable composition arranged on a substrate.

FIG. 2 shows an image obtained by capturing, by a camera 109, a plurality of droplets of a photo-curing composition arranged on a substrate 101. In FIG. 2, each circle indicates a droplet. The arrangement of the plurality of droplets can be controlled by, for example, the discharge timing of a droplet of the photo-curing composition by a dispenser 108 and driving of the substrate 101 by a substrate driving mechanism 102. The minimum droplet interval can be decided by the discharge frequency of a droplet from the dispenser 108 and the driving speed of the substrate 101 by the substrate driving mechanism 102. In this example, the interval of droplets in the vertical direction is 250 μm, and the interval of droplets in the horizontal direction is 200 μm. However, this is merely an example and can appropriately be changed.

Figure 3:
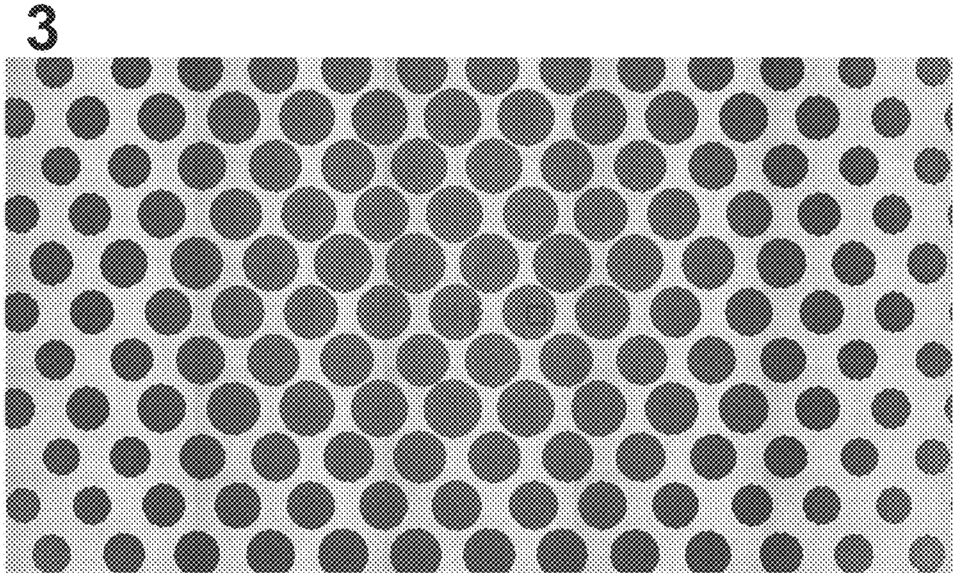
FIG. 3 is a view showing an image obtained by capturing, by the camera, the plurality of droplets in a process of spreading between the substrate and a mold after the mold is brought into contact with the plurality of droplets on the substrate.
Figure 4:
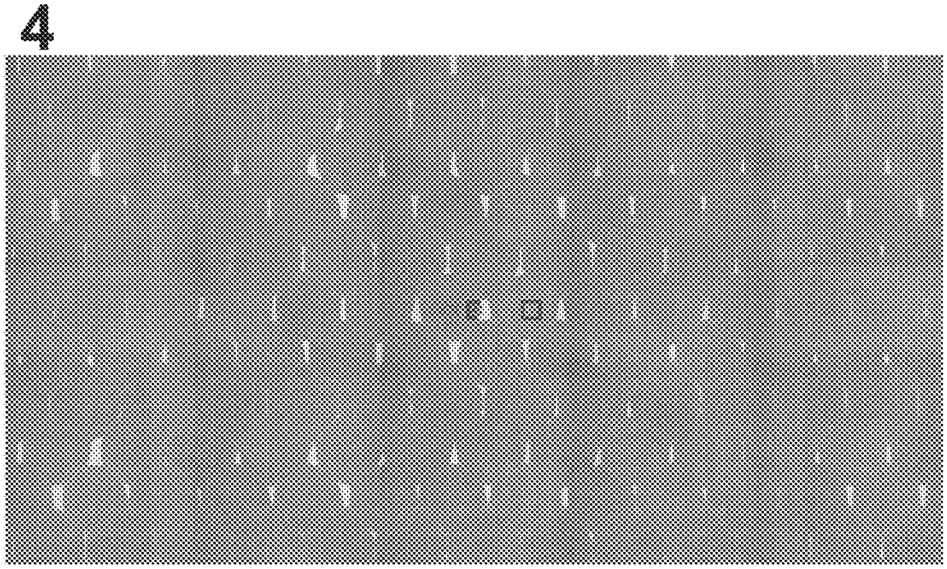
FIG. 4 is a view showing an image obtained by capturing, by the camera, the plurality of droplets in a process of spreading between the substrate and a mold after the mold is brought into contact with the plurality of droplets on the substrate.

FIGS. 3 and 4 each show an image obtained by capturing, by the camera 109, the plurality of droplets in a process of spreading between the substrate 101 and a mold 103 after the mold 103 is brought into contact with the plurality of droplets on the substrate 101. FIG. 4 shows the image captured after the image shown in FIG. 3. Here, for the sake of experiments, a mold having no pattern on its surface (the surface that comes into contact with droplets) is used as the mold 103. Hence, the mold 103 does not give directivity to spread of each droplet, and each droplet spreads while maintaining the circular shape. As exemplified in FIG. 4, if a liquid film is formed by connecting four droplets that are adjacent to each other, a bubble is confined at the center of the liquid film. If a light irradiator LI irradiates the liquid film with light in this state, the portion of the bubble changes to a cavity, and a defect may occur in a cured film formed by the liquid film. To prevent such defect occurrence, it is necessary to wait until a gas forming bubbles is absorbed by the substrate 101 (underlying film) and the mold 103, and this lowers throughput.

Figure 5:
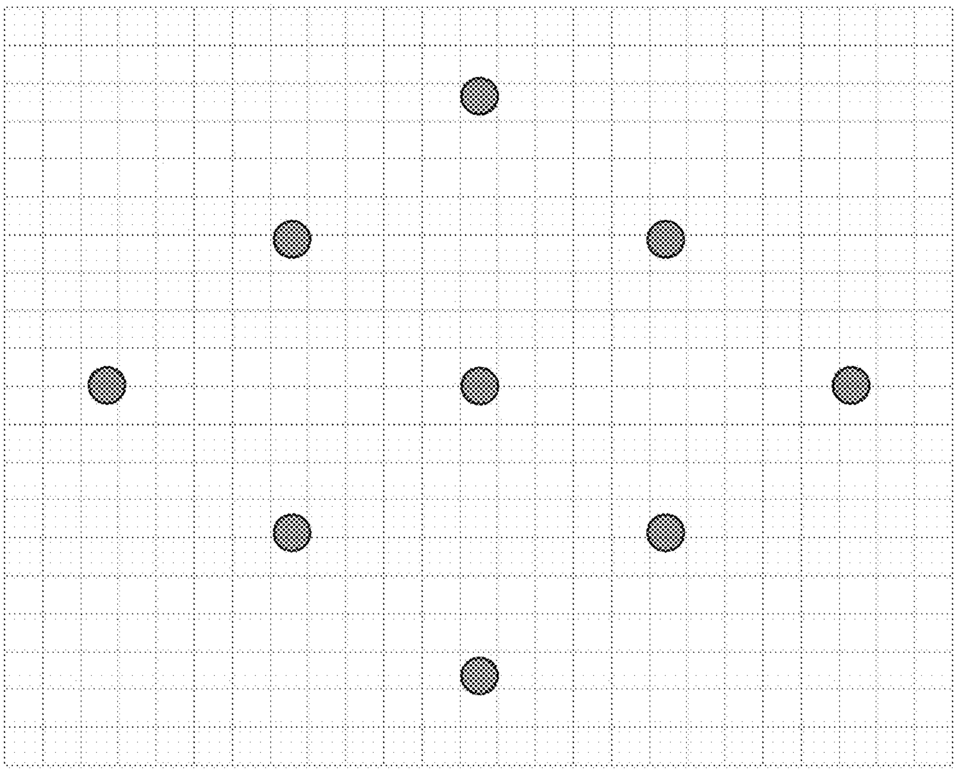
FIG. 5 is a view exemplarily showing the relationship between DMD sections and a plurality of droplets.

FIG. 5 shows the relationship between DMD sections (1 section=25-μm square) and a plurality of droplets (the interval is 250 μm in the vertical direction and 200 μm in the horizontal direction). Each DMD section is a projection of one micromirror of the DMD on the surface of the substrate 101 and is indicated by a small rectangle in FIG. 5. The DMD section is a minimum unit in which irradiation of light can be controlled. Each droplet is indicated by a black circle in FIG. 5. It is found that a plurality of DMD sections exist between a droplet and a droplet. The controller 110 can control the optical modulation device 106 (DMD) such that the shape change of each droplet before droplets adjacent to each other are connected to each other satisfies a target condition. Here, by controlling light irradiation for each DMD section (each micromirror), the viscosity of the photo-curing composition can be controlled for each DMD section, and the direction of each droplet spreading can thus be controlled. This can prevent or reduce confinement of bubbles in the liquid film.

Figure 6:
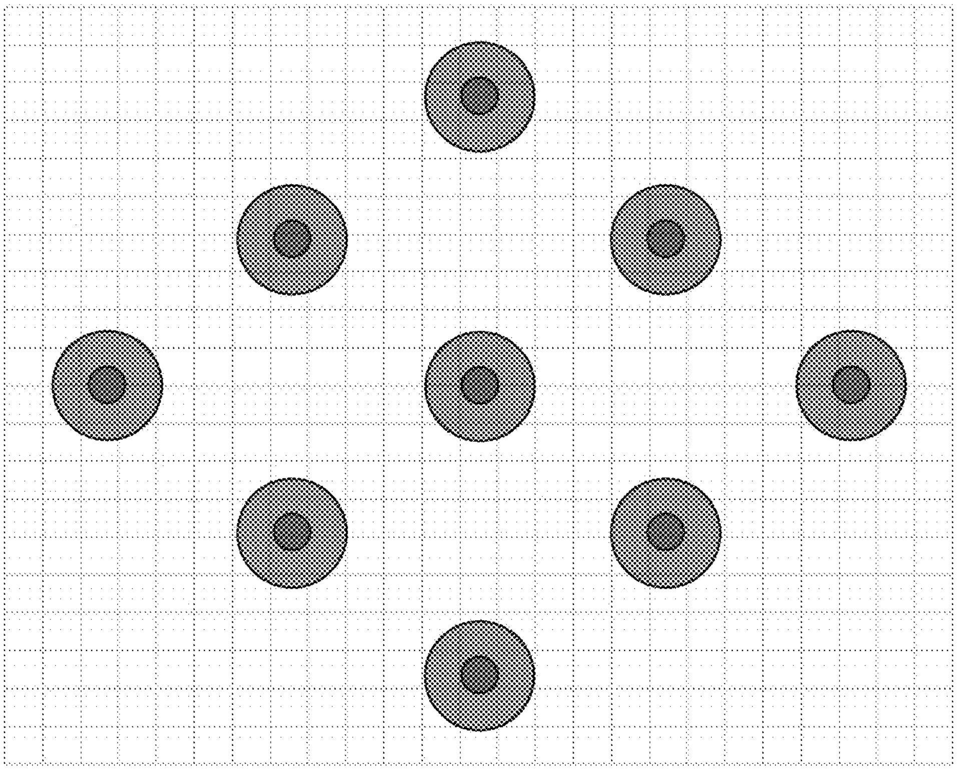
FIG. 6 is a view showing a state in which each droplet spreads while maintaining a circular shape.
Figure 7:
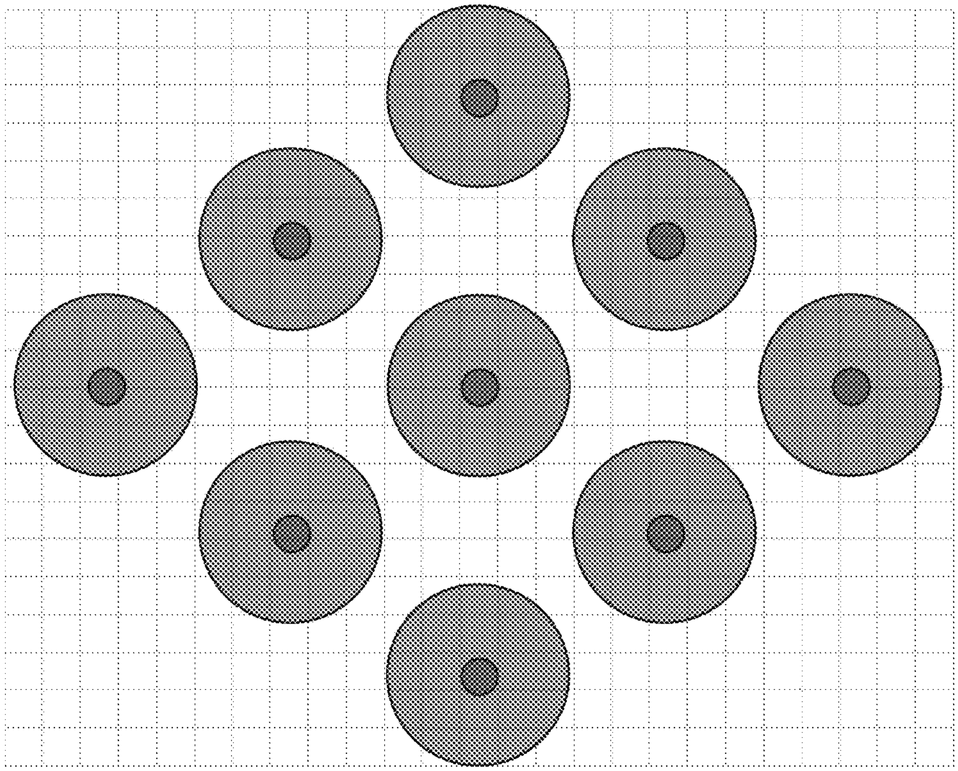
FIG. 7 is a view showing a state in which each droplet spreads while maintaining a circular shape.

FIGS. 6 and 7 show a state in which each droplet spreads while maintaining a circular shape. If each droplet continues to spread while maintaining the circular shape, it can easily be predicted that bubbles are confined in a liquid film formed by connection of droplets adjacent to each other. In this example, the shape (final shape) of each droplet at a boundary where droplets adjacent to each other are connected (merged) to each other or immediately before each droplet is connected (merged) to another droplet is defined in advance, and the DMD is controlled such that no bubbles are confined in the process until the final shape is obtained.

Figure 8:
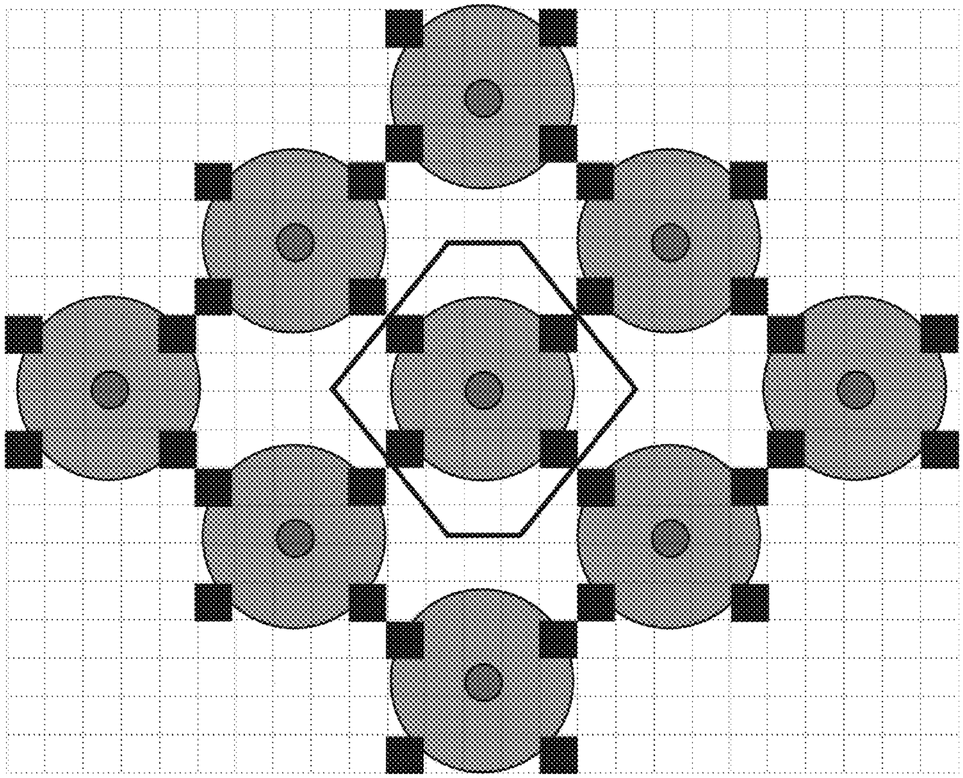
FIG. 8 is a view exemplarily showing the target shape of a droplet at the center at a certain timing before droplets adjacent to each other are connected to each other.

In FIG. 8, the target shape of the droplet at the center at a certain timing before droplets adjacent to each other are connected to each other is exemplified by a black thick line. In FIG. 8, a black rectangle exemplifies a DMD section irradiated with light at this timing. DMD sections located at points where the spread of droplets is relatively close to the target shape at the timing shown in FIG. 8 are irradiated with light to increase the viscosity of the photo-curing composition in the DMD sections, thereby speeding down the spread of the droplets.

Figure 10:
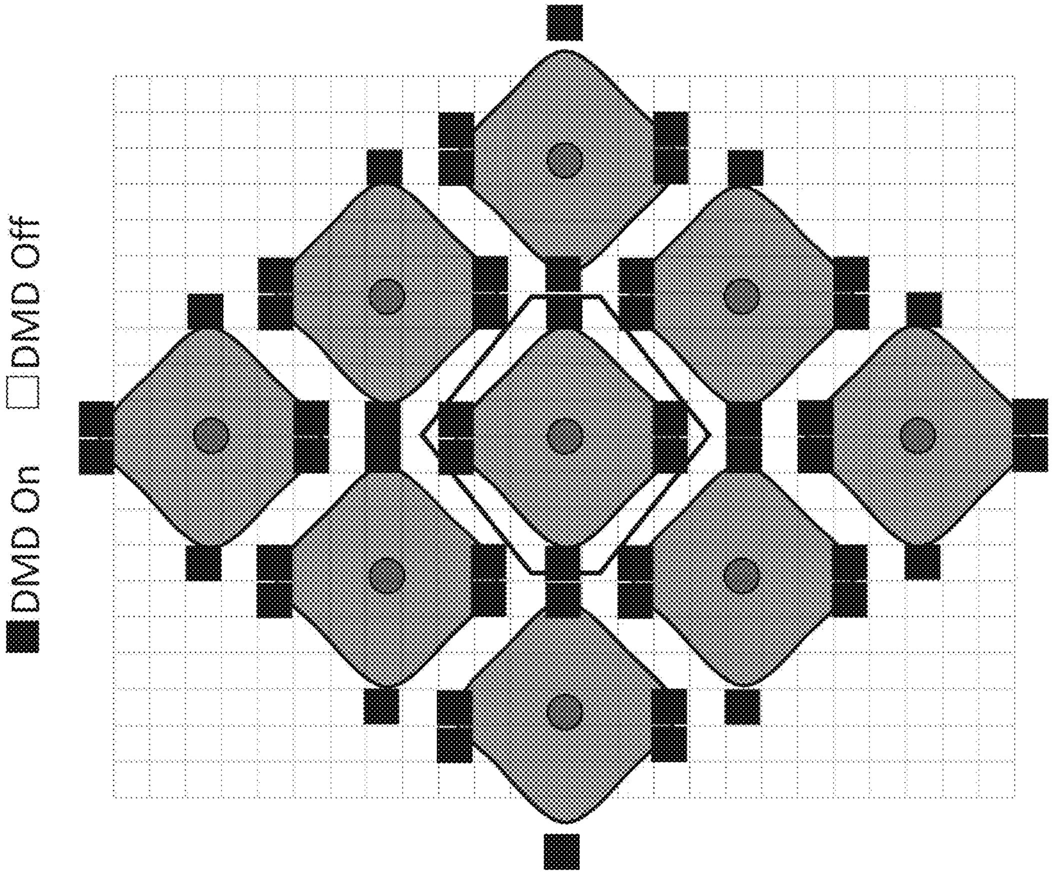
FIG. 10 is a view exemplarily showing a state in which DMD sections located at points relatively close to the target shape are irradiated with light based on the target shape and the shapes of the droplets at the timing shown in FIG. 9.
Figure 9:
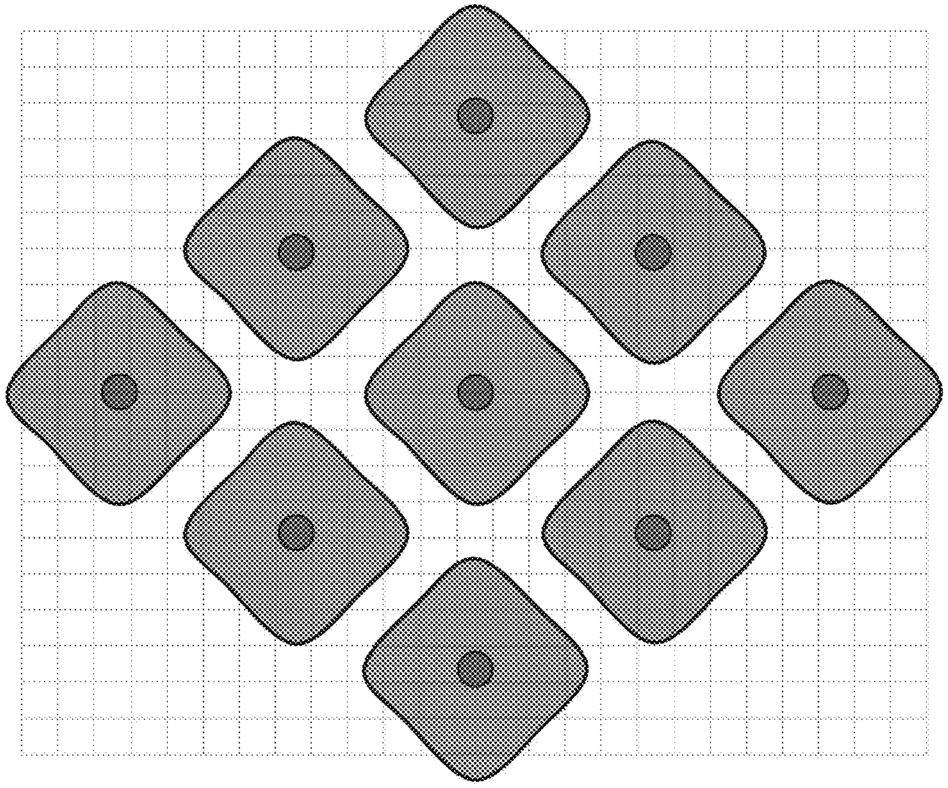
FIG. 9 is a view exemplarily showing the shapes of the plurality of droplets at a certain timing before droplets adjacent to each other are connected to each other.
Figure 12A:
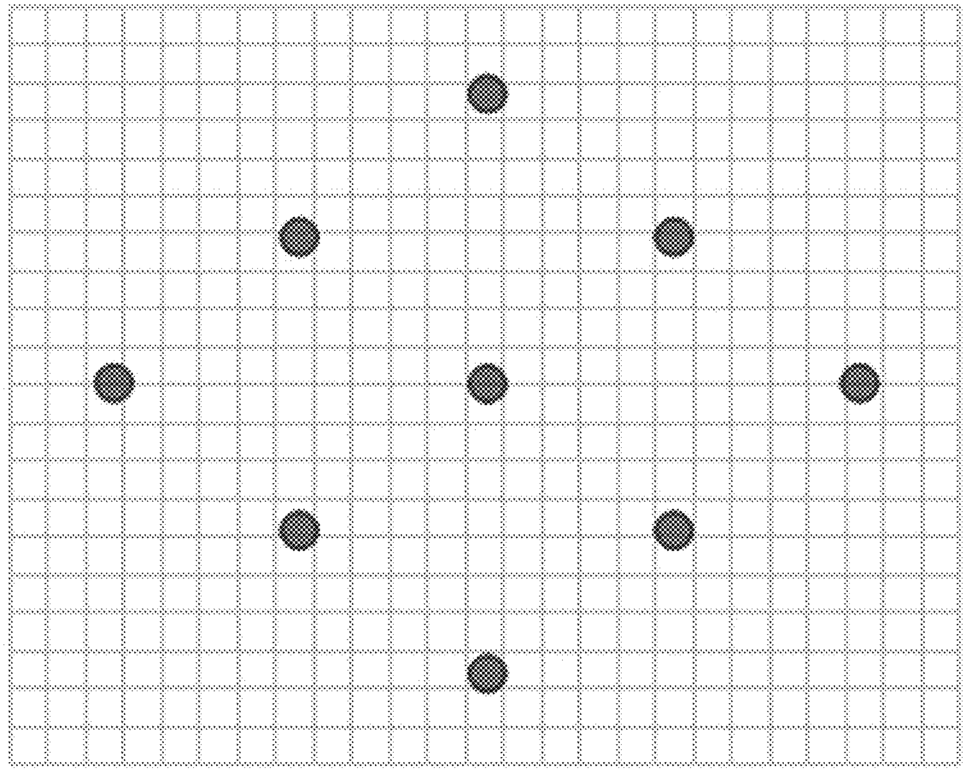
FIGS. 12A to 12F are views exemplarily showing the shape change of a plurality of droplets in a case where the target final shape is rhombic.
Figure 11:
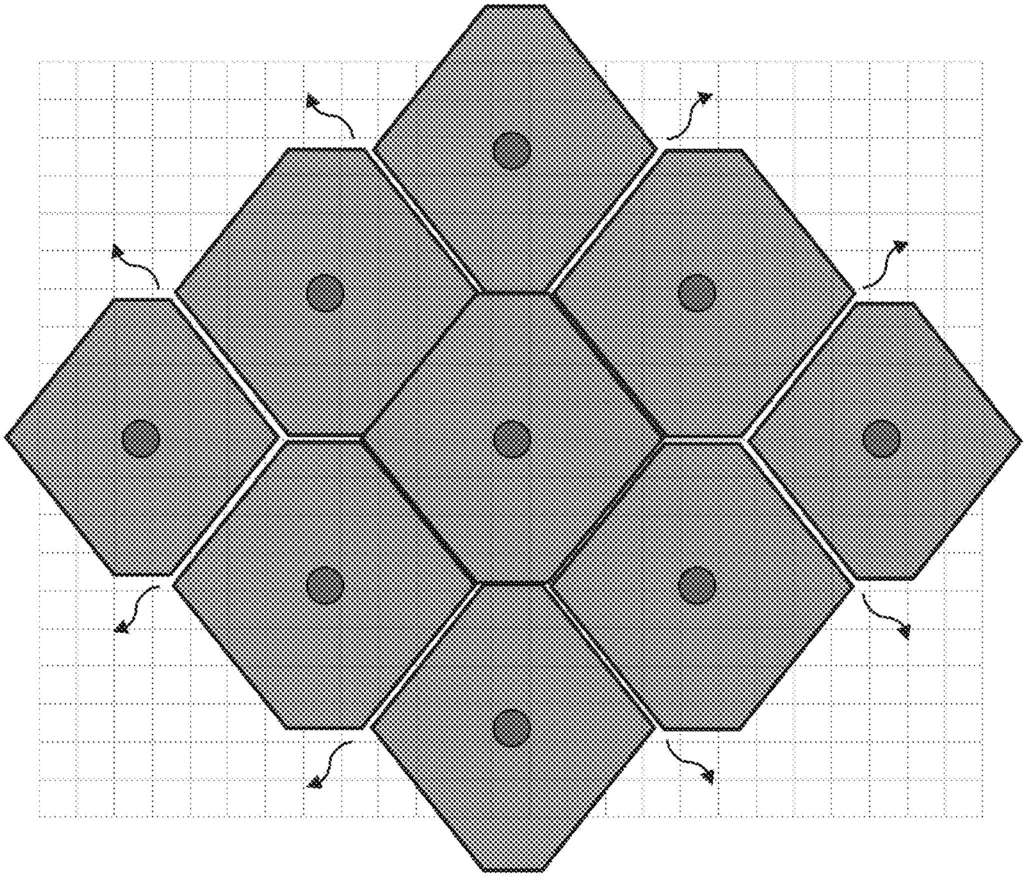
FIG. 11 is a view exemplarily showing a state in which each droplet has reached a target final shape without confining bubbles.
Figure 12C:
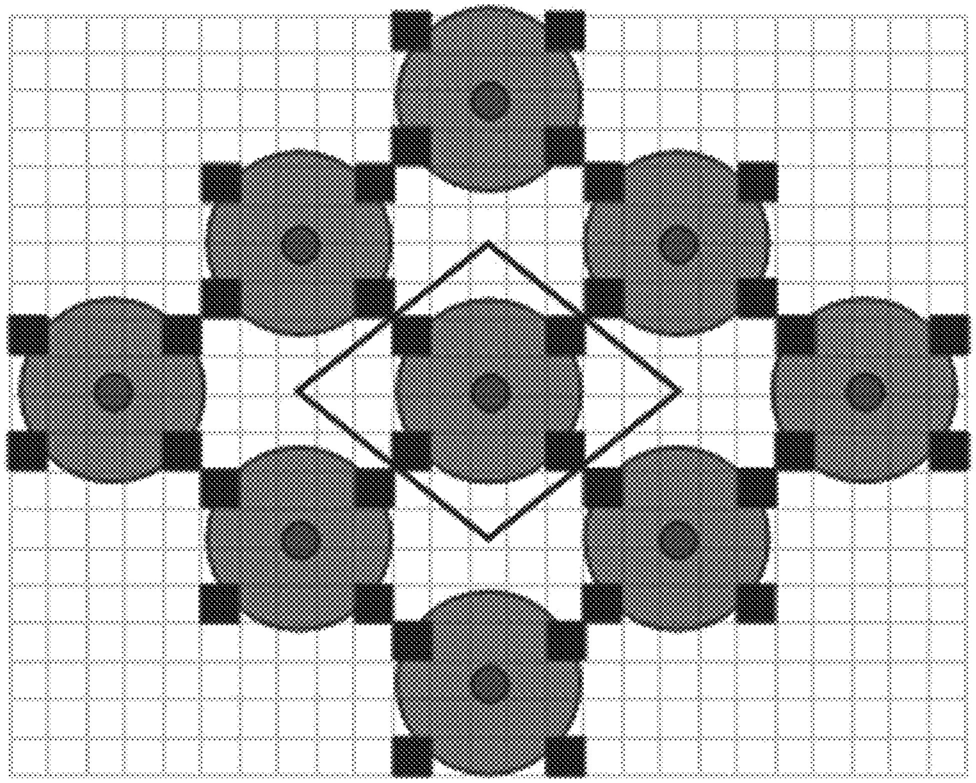
Figure 12B:
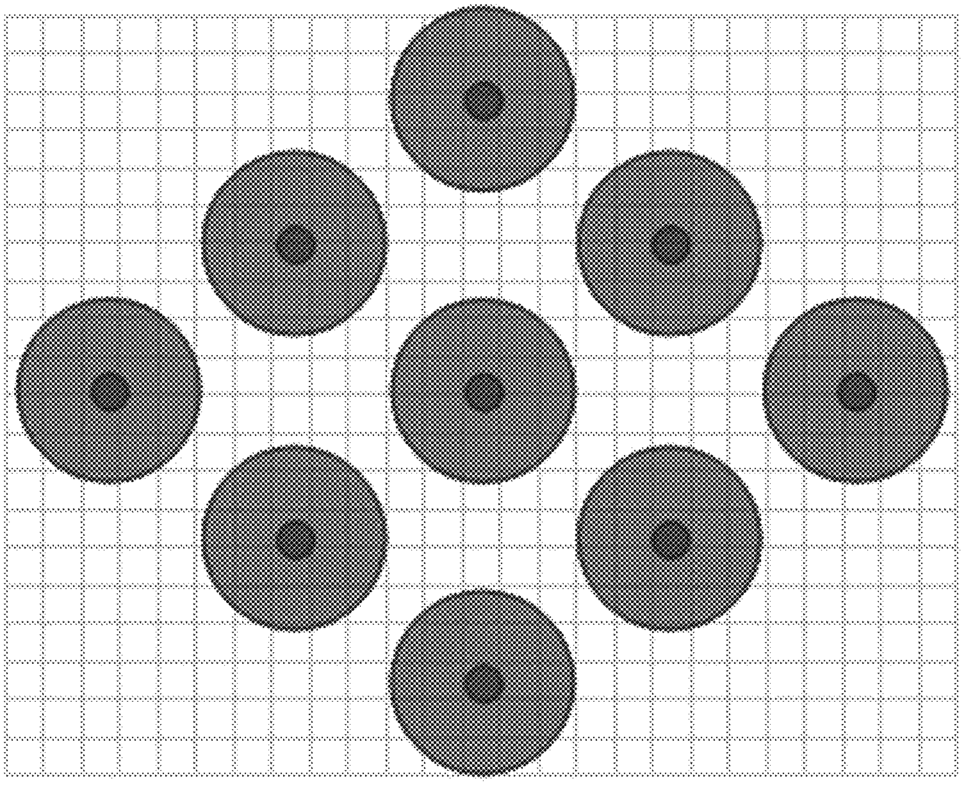
Figure 12D:
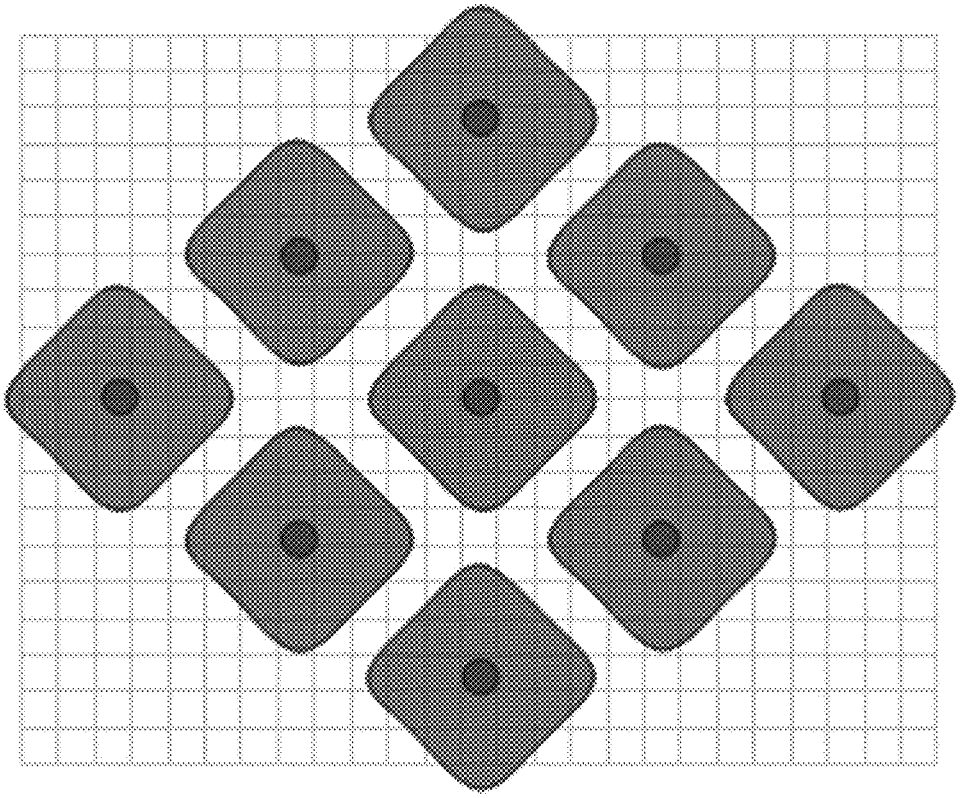
Figure 12E:
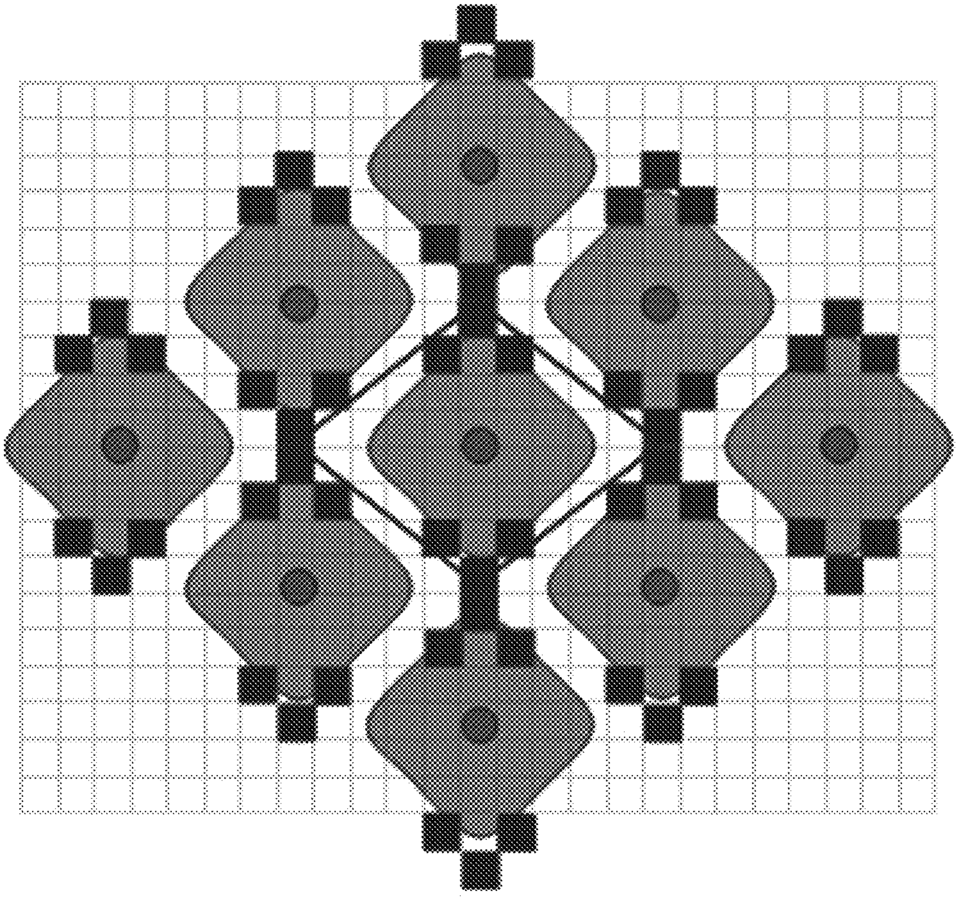
Figure 13A:
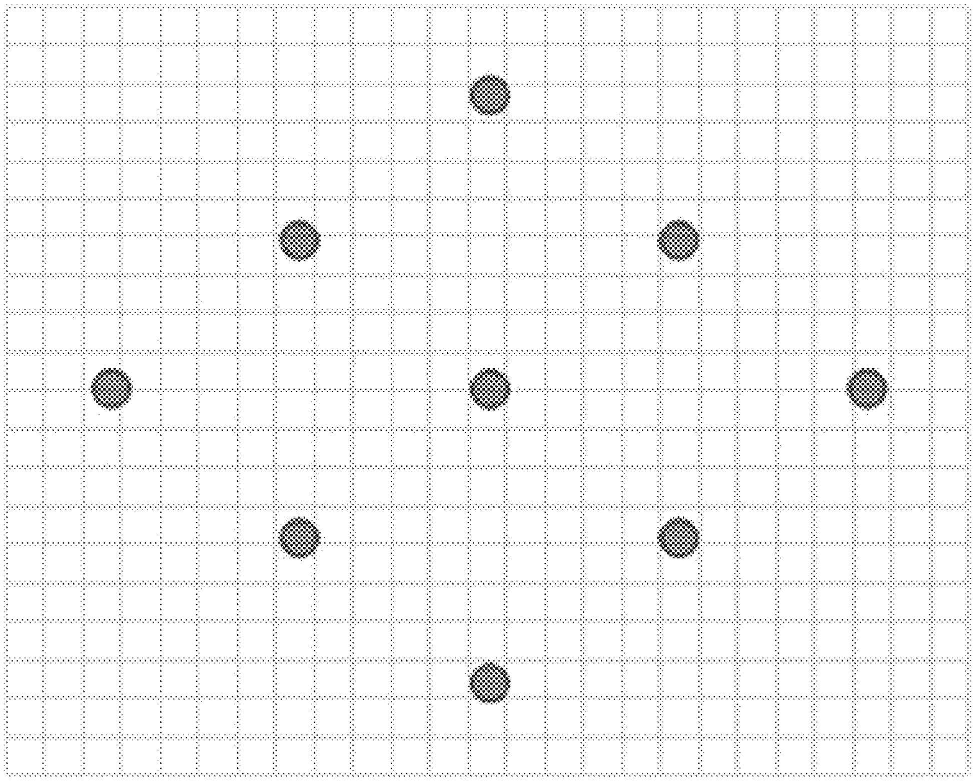
FIGS. 13A to 13E are views exemplarily showing the shape change of a plurality of droplets in a case where the target final shape is rectangular.
Figure 12F:
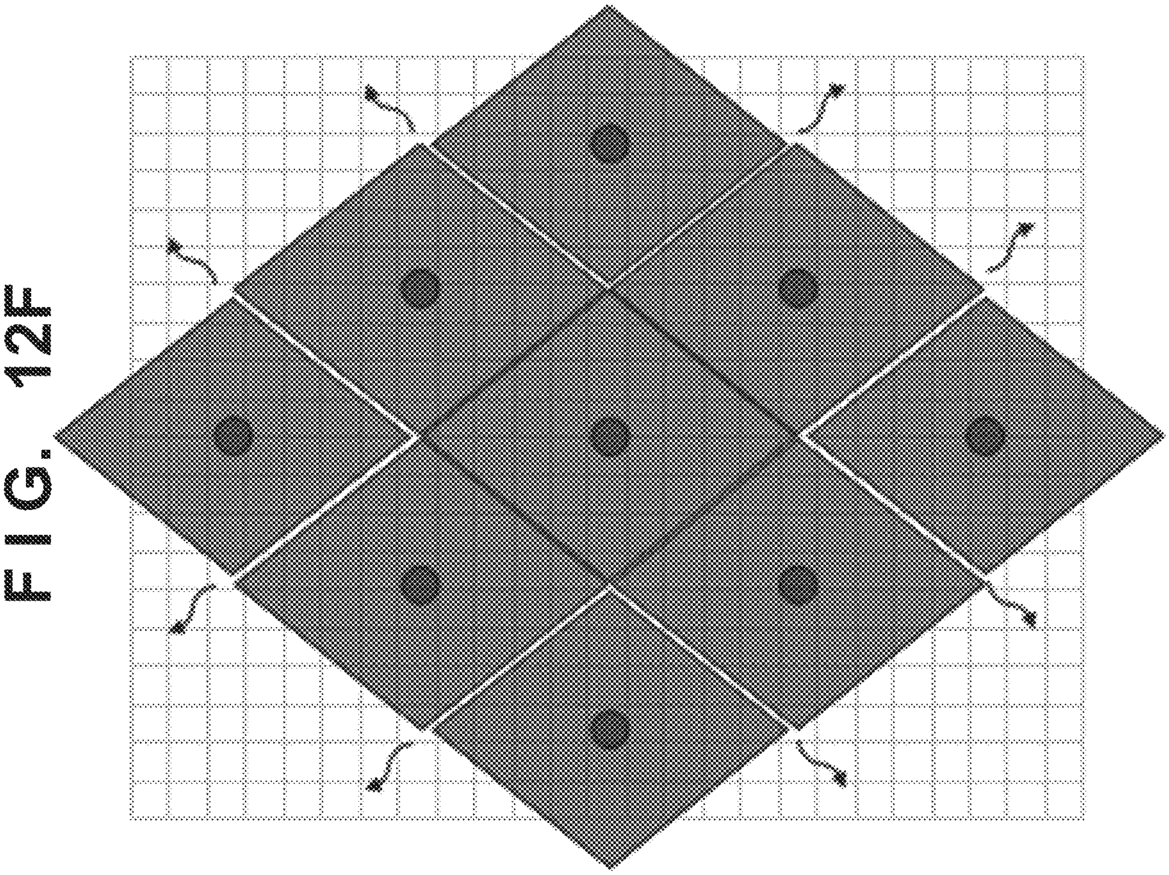
Figure 13C:
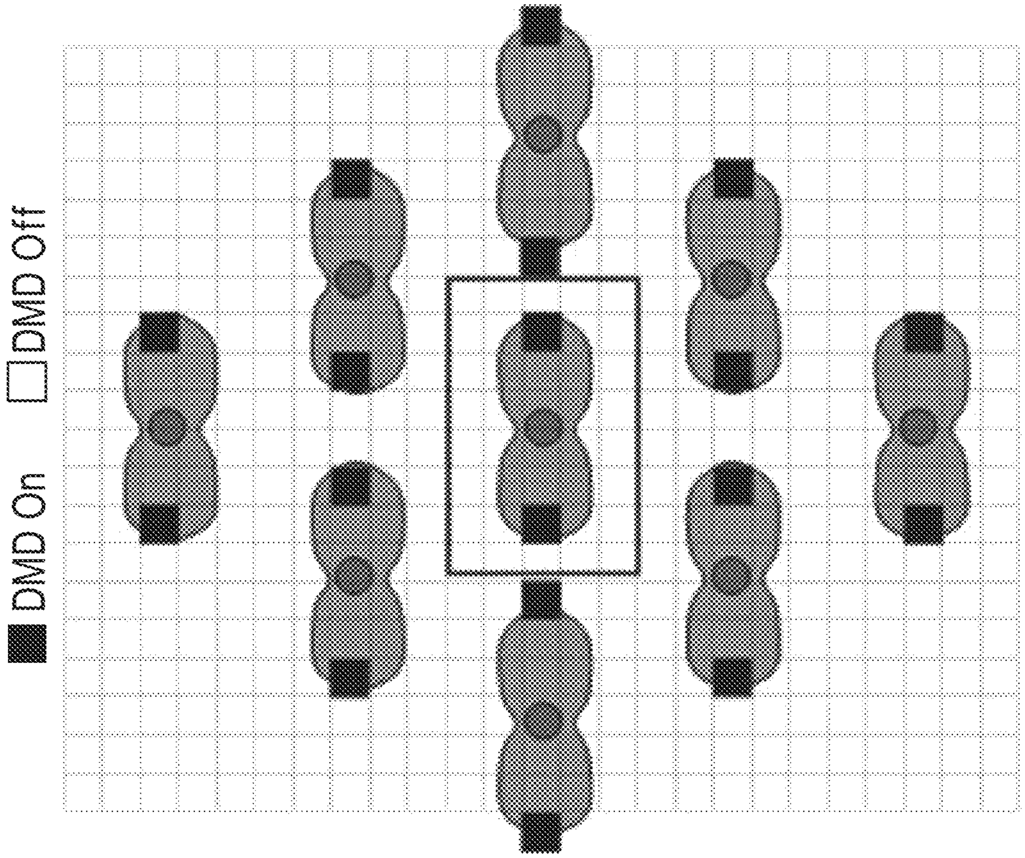
Figure 13B:
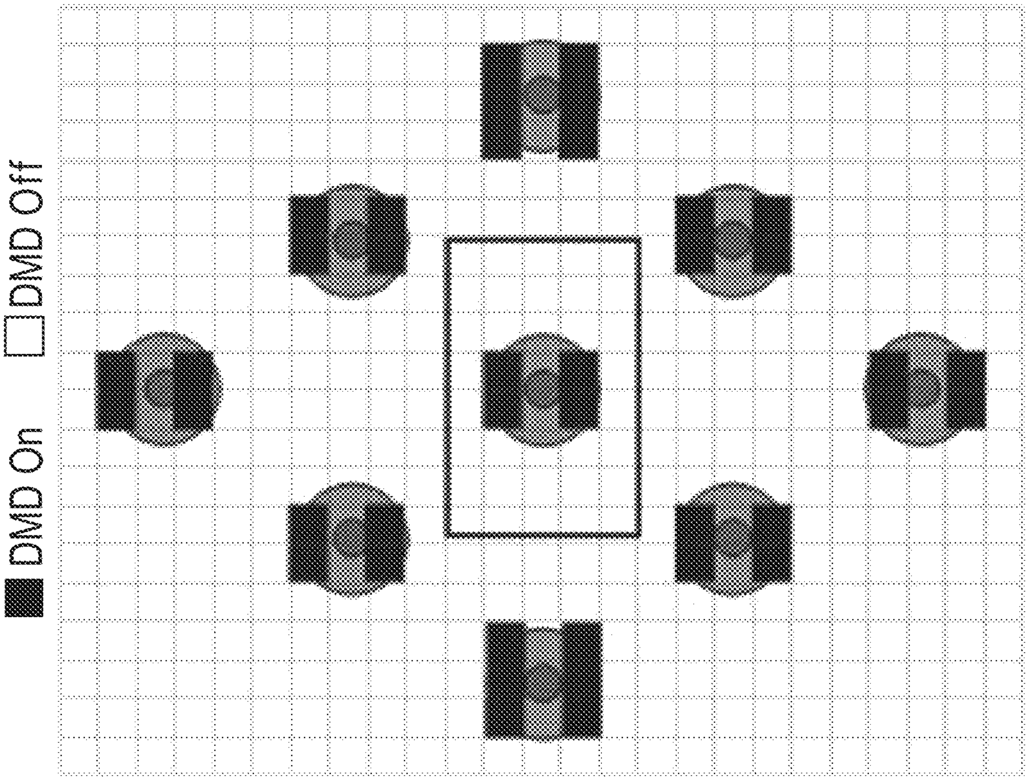
Figure 13E:
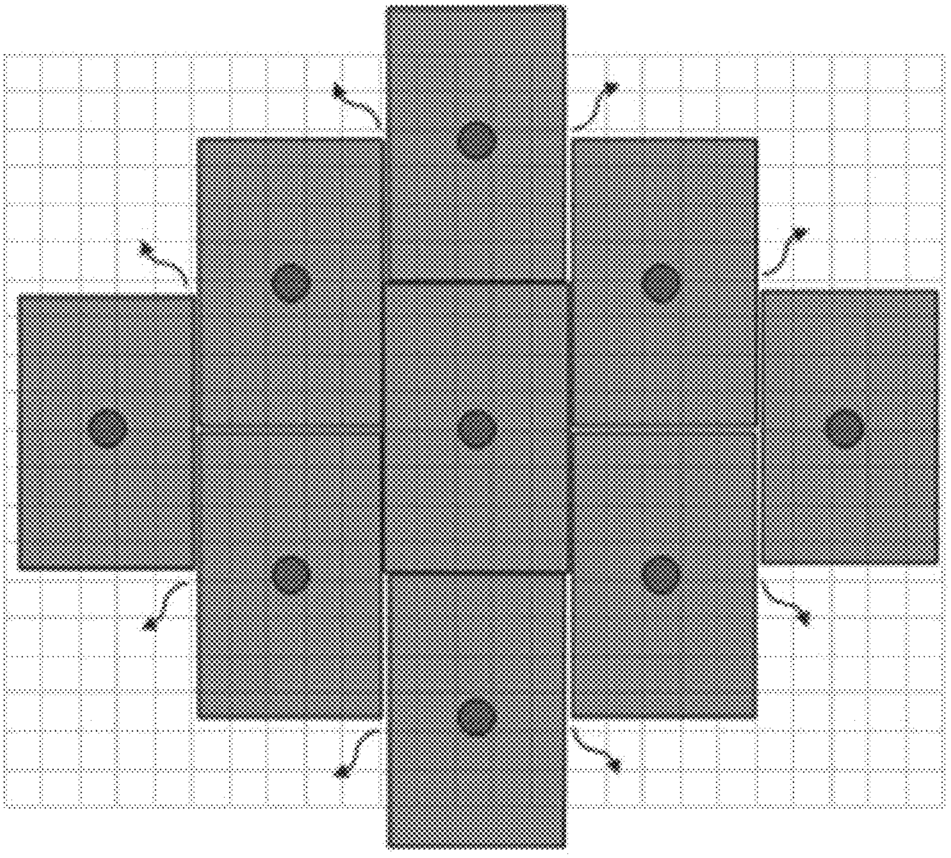
Figure 13D:
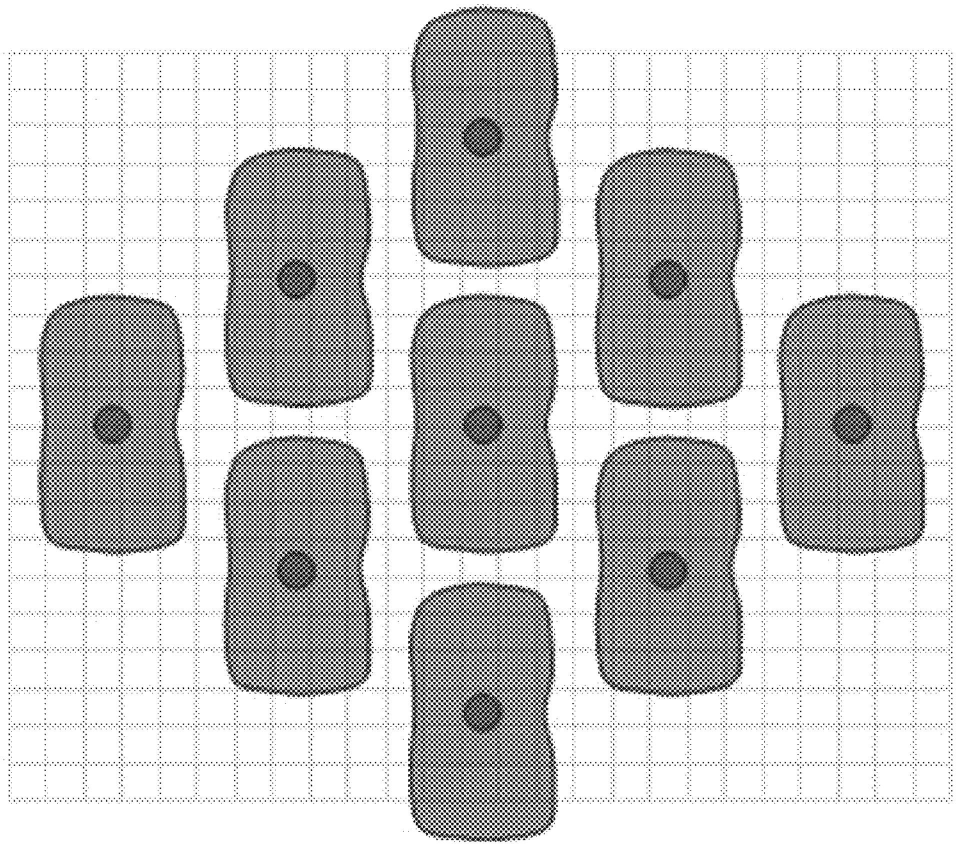

FIG. 9 shows a state in which each droplet is formed into not a circular shape but a rhombic shape by irradiation of light shown in FIG. 8. FIG. 10 shows a state in which DMD sections located at points relatively close to the target shape are irradiated with light based on the target shape and the shapes of the droplets at the timing shown in FIG. 9. FIG. 11 shows the control result of the shapes of the droplets. According to this example, each droplet can be spread in such a form that makes the gaps between the droplets even. As a result, as indicated by arrows in FIG. 11, the gas is discharged via the even gaps, and bubble confinement in the liquid film can be prevented or reduced.

According to the above-described method, the spread direction or directivity of each droplet can be controlled, and therefore, the spread of the droplets can be controlled such that the shape change of each droplet satisfies the target shape.

As another example, FIGS. 12A to 12F show an example in which the target shape at each time is a rhombic shape. As still another example, FIGS. 13A to 13E show an example in which the target shape at each time is a rectangular shape. In the examples shown in FIGS. 12A to 12F and 13A to 13E, time proceeds in the order of A, B, C, D, E, and F.

Figure 14:
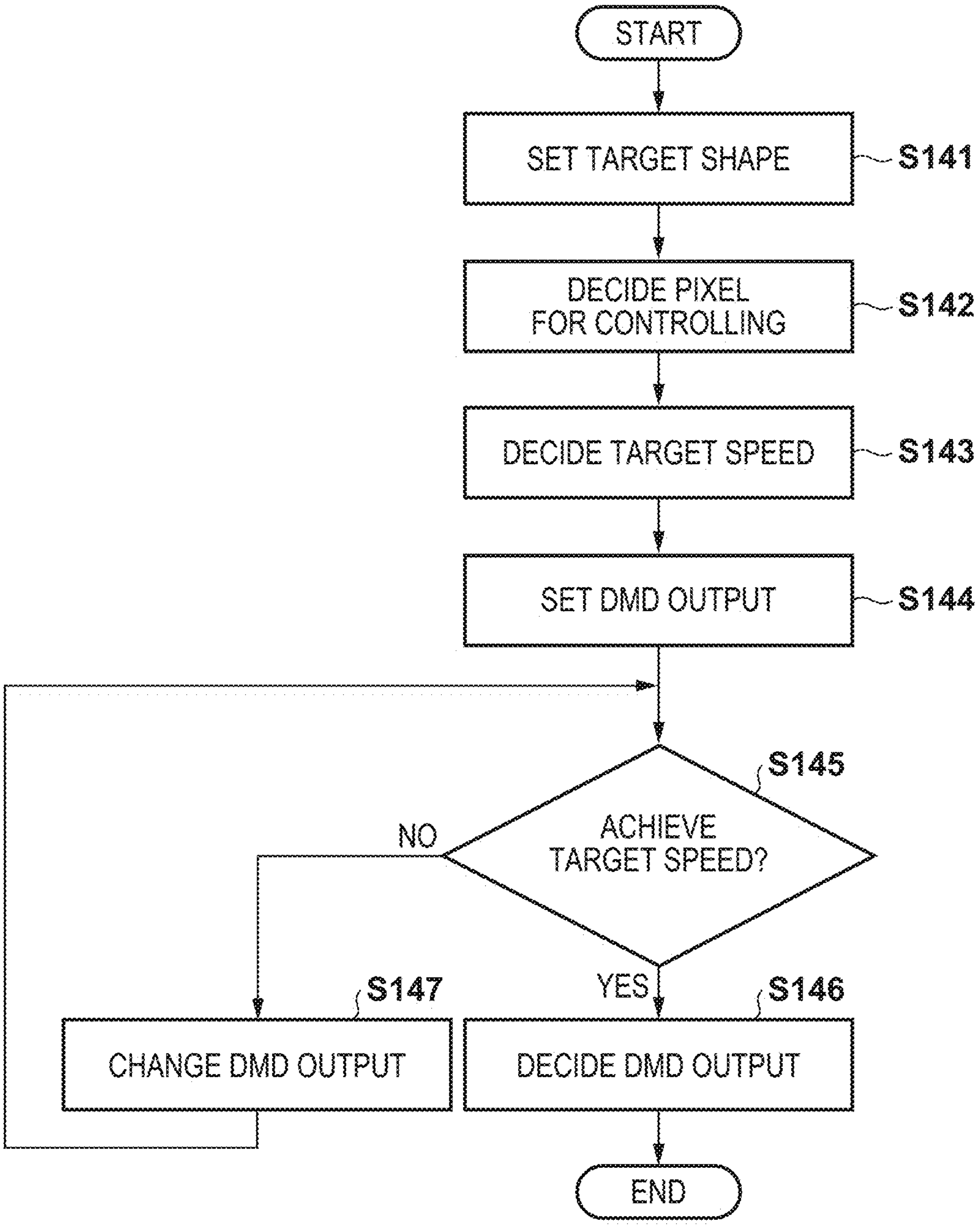
FIG. 14 is a flowchart exemplarily showing the procedure of an information processing method for generating control information for controlling spread of a plurality of droplets of a photo-curing composition arranged between a substrate and a mold.

FIG. 14 exemplarily shows an information processing method for generating control information for controlling spread of a plurality of droplets of a photo-curing composition arranged between a substrate and a mold. The information processing method shown in FIG. 14 may be executed by the controller 110 or may be executed by another information processing apparatus. The information processing method shown in FIG. 14 can be executed by supplying a program to a processor serving as the controller 110 or an information processing apparatus and causing the processor to operate in accordance with the program. The information processing method shown in FIG. 14 can generate, as a part of control information, control data that controls the irradiation condition of light to each of a plurality of droplets such that the shape change of each of the plurality of droplets before droplets adjacent to each other among the plurality of droplets are connected to each other satisfies a target condition. The irradiation condition can include a spatial illuminance distribution of light irradiated to each of the plurality of droplets. Alternatively, the irradiation condition can include a spatial illuminance distribution of light irradiated to each of the plurality of droplets at each of a plurality of times. The plurality of droplets are irradiated with light via the optical modulation device 106, and a plurality of pixels among all pixels of the optical modulation device 106 can be assigned to regions in which the plurality of droplets spread. The control data can include data that controls the optical modulation device 106. The plurality of pixels among all pixels of the optical modulation device 106 can be at least nine pixels. The control data can include at least one of the irradiation position, the illuminance, the irradiation timing, the irradiation period, and the focal depth of light irradiated, via the optical modulation device 106, to the space between the substrate 101 and the mold 103.

The information processing method can include steps S141 to S147. Steps S141 to S147 can be controlled by the controller 110. In step S141, a target shape can be set for each droplet. In step S142, for each droplet, a micromirror (pixel) (a DMD section in another viewpoint) for controlling the shape change of the droplet can be decided. In step S143, for each droplet, a target speed (the target of the proceeding speed of the outer edge of the droplet) in each of a plurality of directions viewed from the center of the droplet can be decided. In step S144, for each pixel to be controlled concerning each droplet, a DMD output (the irradiation amount of light to each DMD section) can be set (temporarily decided). Steps S145 and S147 are steps of optimizing or finally deciding the DMD output (control of light irradiation by the DMD). In step S145, it is determined whether the target speed decided in step S143 is achieved by the DMD output set or changed in step S144 (step S147 if step S145 is executed next to step S147). If the determination result of step S145 is "YES", step S146 is executed. If the determination result of step S145 is "NO", step S147 is executed. In step S147, the DMD output can be changed. In step S146, for each pixel to be controlled concerning each droplet, the DMD output can be decided. A detailed example of steps S141 to S147 will be described below with reference to FIGS. 15 to 23.

Figure 15:
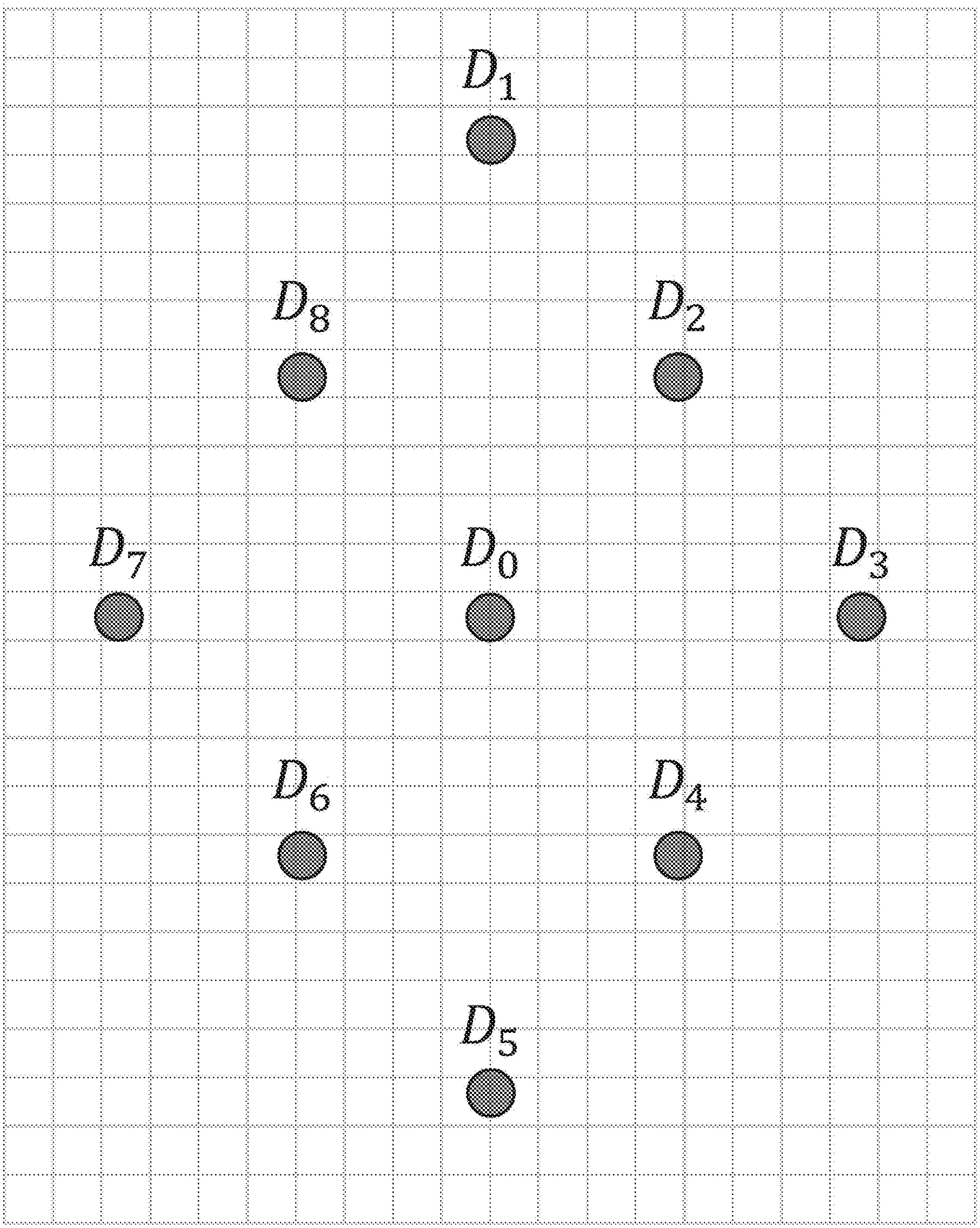
FIG. 15 is a view exemplarily showing the arrangement of a plurality of droplets on a substrate.

FIG. 15 shows the arrangement of droplets on a substrate. This arrangement example includes a plurality of droplets $D_0$ to $D_8$ indicated by black circles. Here, to simplify the explanation, placing focus on the droplet $D_0$, controlling spread of the droplet $D_0$ while maintaining the shape of the droplet $D_0$ in a hexagonal shape will be described. Shape control of the remaining droplets can also be done by the same method.

Figure 16:
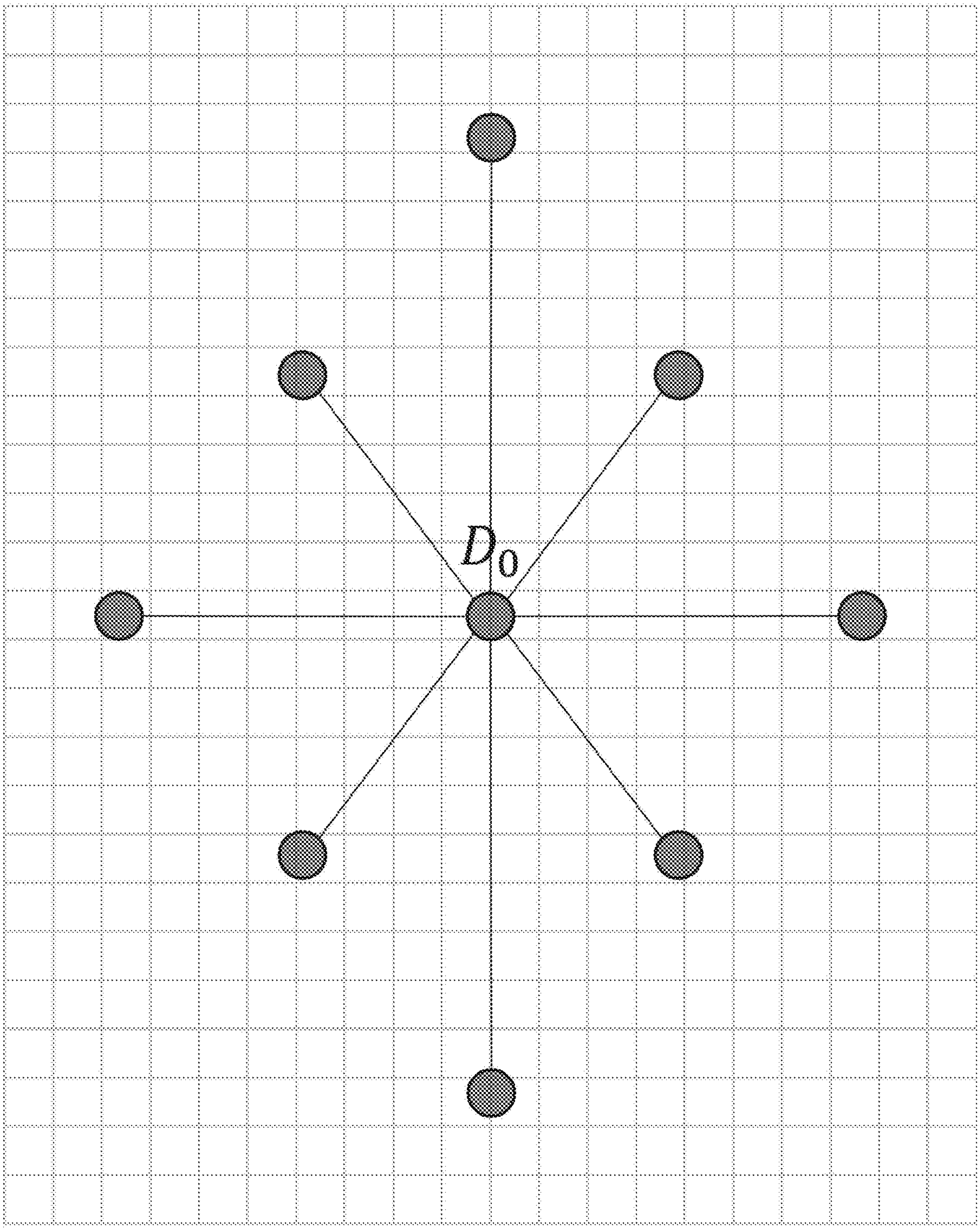
FIG. 16 is a view showing a state in which a plurality of droplets and a droplet $D_0$, which are associated with the target shape, are connected by solid lines.
Figure 17:
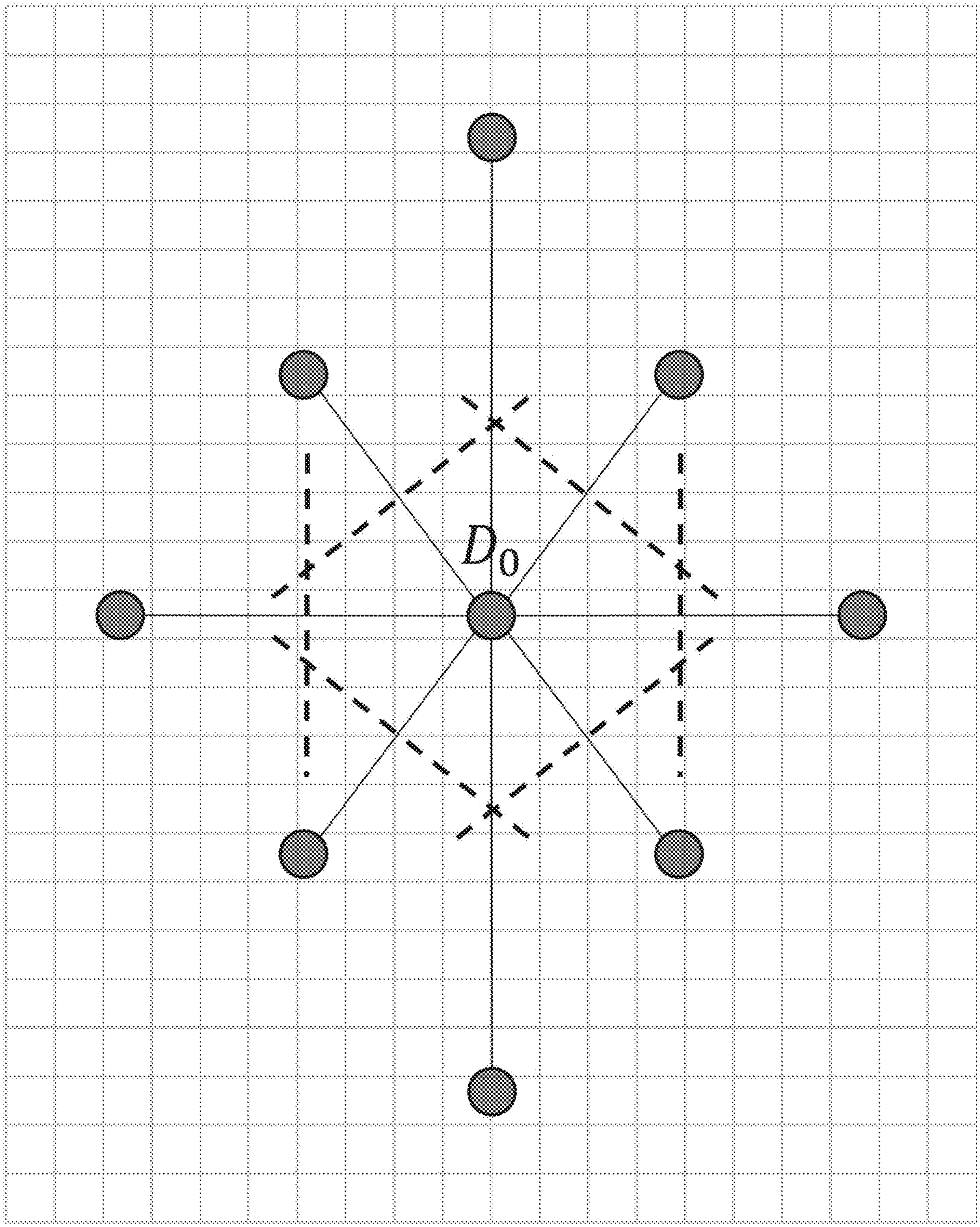
FIG. 17 is a view showing the perpendicular bisectors (lines indicated by dotted lines) of the plurality of lines indicated by the solid lines explained in FIG. 16.
Figure 18:
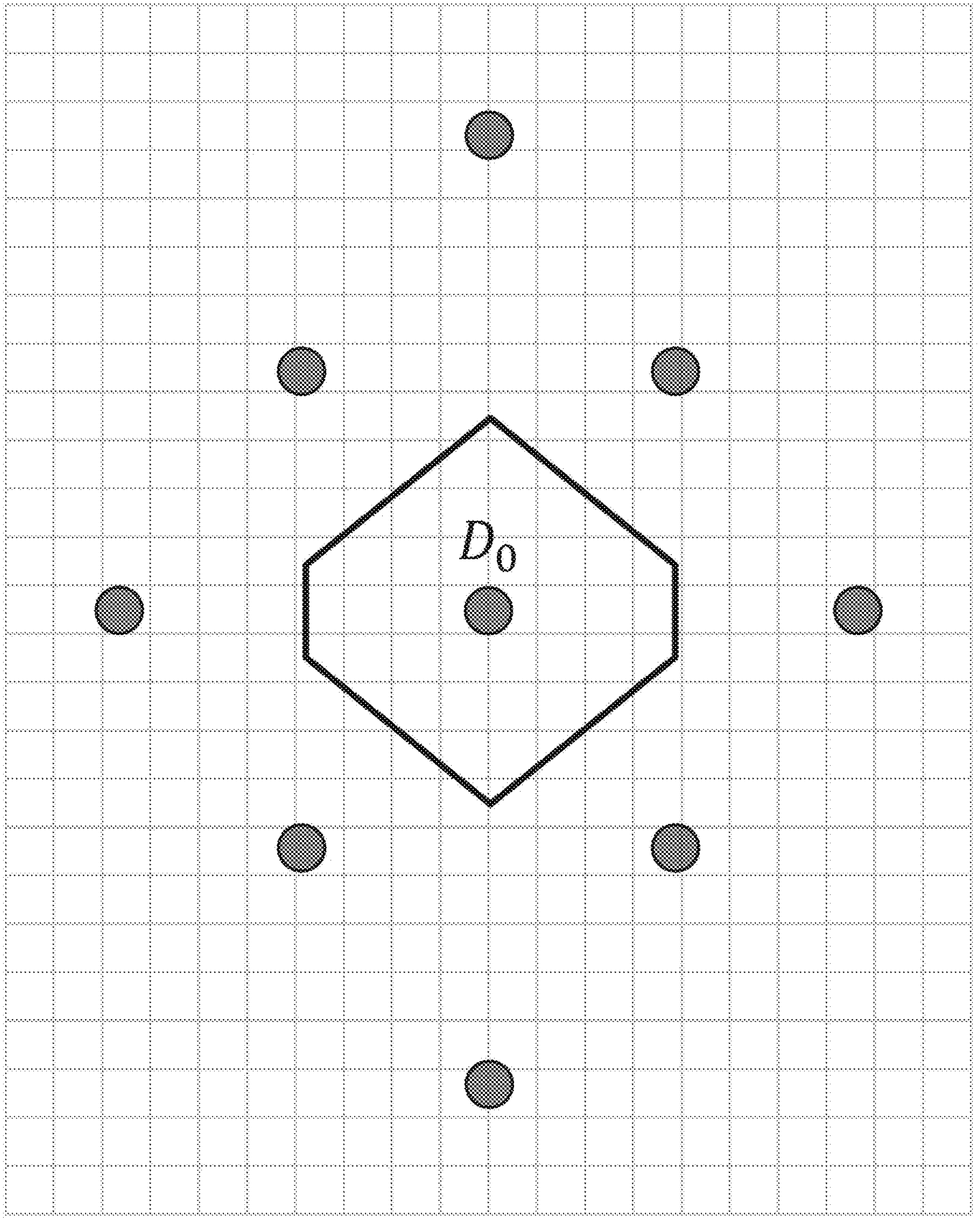
FIG. 18 is a view exemplarily showing a target final shape.

FIGS. 16 to 18 exemplarily show a method or step (S141) of setting the target shape of the droplet $D_0$ to a hexagonal shape. First, as exemplified in FIG. 16, lines (lines indicated by solid lines) that connect the center position of the droplet $D_0$ and the center positions of the droplets on the periphery are decided. Next, as exemplified in FIG. 17, the perpendicular bisectors (lines indicated by dotted lines) of the plurality of lines indicated by the solid lines explained in FIG. 16 are decided. Next, as exemplified in FIG. 18, a figure (indicated by a thick line) surrounded by the plurality of lines (perpendicular bisectors) indicated by the dotted lines explained in FIG. 17 is decided as the target shape. Note that although an example of the method of setting the target shape to a hexagonal shape has been described here, another shape such as a rhombic shape or a rectangular shape may be set to the target shape, and various algorithms can be employed for this.

Figure 19:
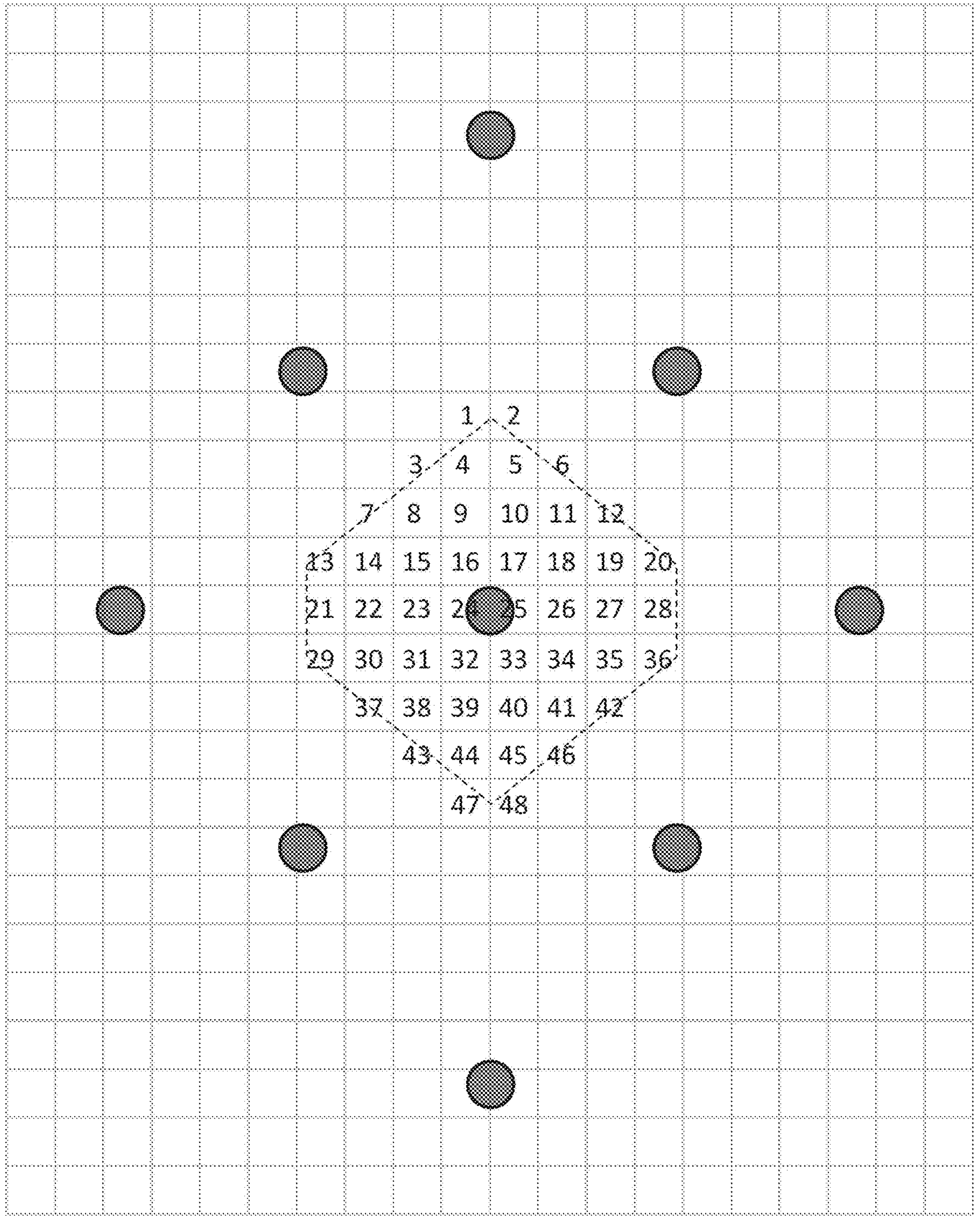
FIG. 19 is a view showing the numbers of pixels (DMD sections) that affect the spread behavior of the droplet $D_0$ when spreading.

FIG. 19 exemplarily shows a method or step (S142) of deciding a micromirror (pixel) (a DMD section in another viewpoint) for controlling the shape change of the droplet based on the target shape decided by the processing shown in FIGS. 16 to 18. In this example, 48 pixels numbered 1 to 48 are decided as the pixels for controlling the shape change of the droplet.

Figure 20:
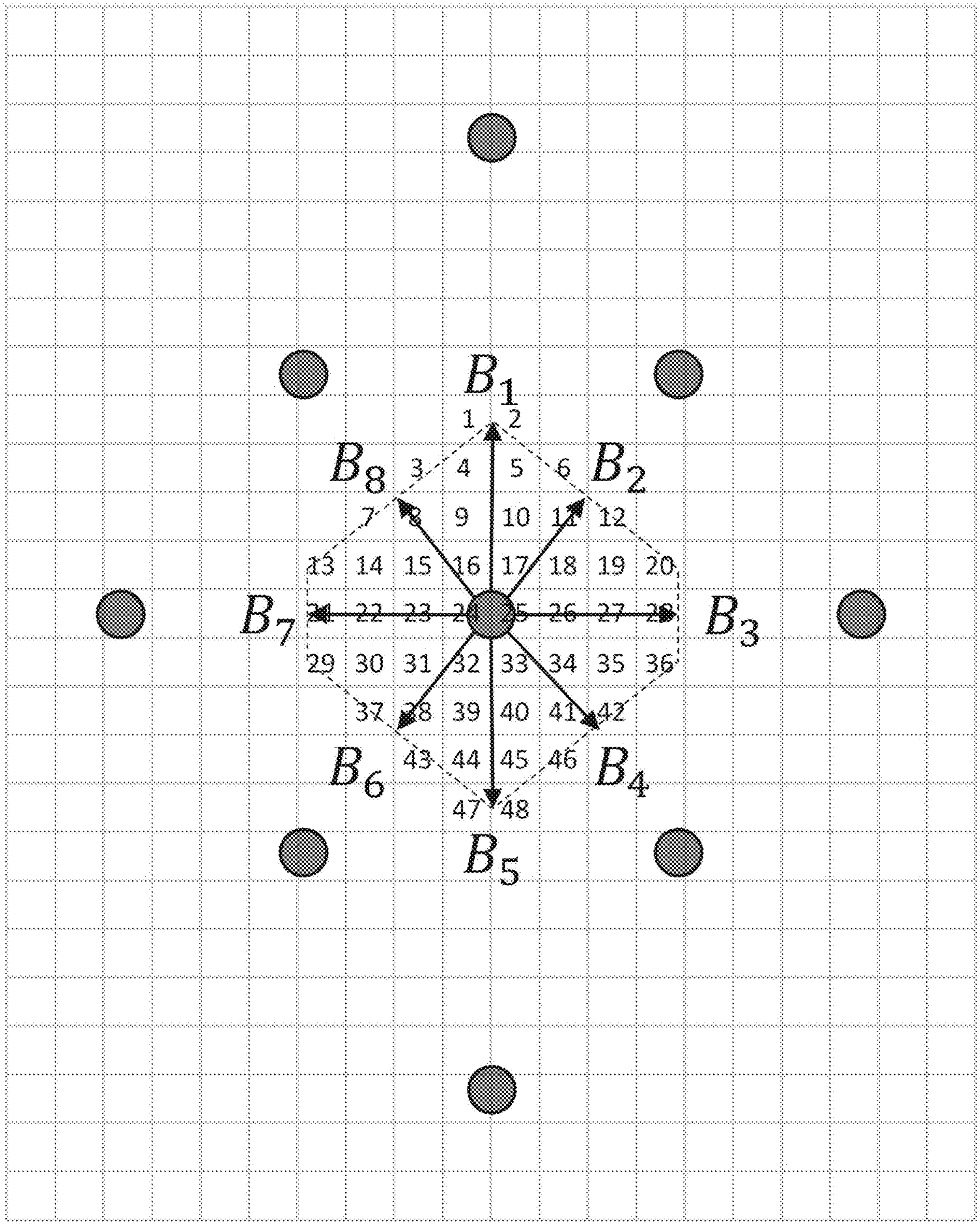
FIG. 20 is a view showing eight directions (the droplet shape at time 0) used for shape control of the droplet $D_0$.

FIG. 20 exemplarily shows a method or step (S143) of deciding the target speed. In FIGS. 20, $B_1$ to $B_8$ indicate directions in which the droplet $D_0$ spreads from its center to the centers of the droplets $D_1$ to $D_8$. Here, the target spread speed of the droplet $D_0$ is decided for each of the directions $B_1$ to $B_8$. To control the shape of the droplet $D_0$ to the hexagonal shape, control is preferably performed to make the speed of spreading in the directions $B_2$, $B_4$, $B_6$, and $B_8$ is relatively low and make the speed of spreading in the directions $B_3$ and $B_7$ relatively high.

The spread speed of the droplet $D_0$ can be controlled by a DMD output condition. A DMD output decision method will be described with reference to FIGS. 20 to 22. Here, letting $V_n(t)$ be the spread speed of the droplet $D_0$ in a direction $B_n$ at time t, equation (1) is assumed. $V_n$ is the spread speed in the direction $B_n$ when illuminance is zero. $R_i(t)$ is the area ratio of the photo-curing composition (droplet) in a pixel i (DMD section i) corresponding to the ith micromirror. $I_i(t)$ is the illuminance of the pixel i (DMD section i). $A_{i,n}$ is the degree of influence of the pixel i (DMD section i) on the spread speed in the direction $B_n$.

$$V_n(t) = V_n\left(1 - \sum A_{i,n} R_i(t) I_i(t)\right) \tag{1}$$

Equation (1) shows that the more conditions (a), (b), and (c) below are satisfied, the smaller the spread speed of the droplet is.

(a) The area ratio of the photo-curing composition (droplet) in the pixel (DMD section) is large ($R_i$=large), (b) The illuminance of light irradiated to the pixel (DMD section) is large ($I_i$=large), and (c) The degree of influence of the pixel (DMD section) on the spread speed in the direction $B_n$ is large ($A_{i,n}$=large).

Here, $A_{i,n}$, that is the degree of influence of the pixel i (DMD section i) on the spread speed in the direction $B_n$ will be digitized and described with reference to FIG. 20. The element of an ith row and an nth column of the matrix $A_{i,n}$ indicated by equation (2) represents the degree of influence of the pixel i (DMD section i) on the spread speed in the direction $B_n$. For example, the first row represents the influence of pixel 1 (DMD section 1) in the directions $B_1$ to $B_8$. Because of the positional relationship between pixel 1 and the directions $B_1$ to $B_8$, in this example, pixel 1 influences only in the direction $B_1$. Under this condition, even if the DMD light of pixel 1 increases the viscosity of the photo-curing composition in the region, it is assumed that there is no influence on the spread speed of the photo-curing composition in the directions other than the direction $B_1$.

Pixel 2 (DMD section 2) described in the second row is the same as pixel 1. Pixel 3 (DMD section 3) described in the third row influences in both the directions $B_1$ and $B_8$ because of the positional relationship, and the influence is stronger in the direction $B_8$. For the fourth to 48th rows, that is, pixels 4 to 48 as well, the degrees of influence are digitized.

$$A_{i,n} = \begin{bmatrix}
1 & 0 & 0 & 0 & 0 & 0 & 0 & 0 \\
1 & 0 & 0 & 0 & 0 & 0 & 0 & 0 \\
0.5 & 0 & 0 & 0 & 0 & 0 & 0 & 1 \\
1 & 0 & 0 & 0 & 0 & 0 & 0 & 0 \\
1 & 0 & 0 & 0 & 0 & 0 & 0 & 0 \\
0.5 & 1 & 0 & 0 & 0 & 0 & 0 & 0 \\
0 & 0 & 0 & 0 & 0 & 0 & 0 & 1 \\
0 & 0 & 0 & 0 & 0 & 0 & 0 & 1 \\
1 & 0 & 0 & 0 & 0 & 0 & 0 & 1 \\
1 & 1 & 0 & 0 & 0 & 0 & 0 & 0 \\
0 & 1 & 0 & 0 & 0 & 0 & 0 & 0 \\
0 & 1 & 0 & 0 & 0 & 0 & 0 & 0 \\
0 & 0 & 0 & 0 & 0 & 0 & 1 & 0 \\
0 & 0 & 0 & 0 & 0 & 0 & 1 & 0.5 \\
0 & 0 & 0 & 0 & 0 & 0 & 1 & 1 \\
1 & 0 & 0 & 0 & 0 & 0 & 0 & 1 \\
1 & 1 & 0 & 0 & 0 & 0 & 0 & 0 \\
0 & 1 & 1 & 0 & 0 & 0 & 0 & 0 \\
0 & 1 & 1 & 0 & 0 & 0 & 0 & 0 \\
0 & 0.5 & 1 & 0 & 0 & 0 & 0 & 0 \\
0 & 0 & 0 & 0 & 0 & 0 & 1 & 0 \\
0 & 0 & 0 & 0 & 0 & 0 & 1 & 0 \\
0 & 0 & 0 & 0 & 0 & 0 & 1 & 0 \\
0 & 0 & 0 & 0 & 0 & 1 & 1 & 1 \\
0 & 1 & 1 & 1 & 0 & 0 & 0 & 0 \\
0 & 0 & 1 & 0 & 0 & 0 & 0 & 0 \\
0 & 0 & 1 & 0 & 0 & 0 & 0 & 0 \\
0 & 0 & 1 & 0 & 0 & 0 & 0 & 0 \\
0 & 0 & 0 & 0 & 0 & 0.5 & 1 & 0 \\
0 & 0 & 0 & 0 & 0 & 1 & 1 & 0 \\
0 & 0 & 0 & 0 & 0 & 1 & 1 & 0 \\
0 & 0 & 0 & 0 & 1 & 1 & 0 & 0 \\
0 & 0 & 0 & 1 & 1 & 0 & 0 & 0 \\
0 & 0 & 1 & 1 & 0 & 0 & 0 & 0 \\
0 & 0 & 1 & 0.5 & 0 & 0 & 0 & 0 \\
0 & 0 & 0 & 0 & 0 & 1 & 0 & 0 \\
0 & 0 & 0 & 0 & 0 & 1 & 0 & 0 \\
0 & 0 & 0 & 0 & 1 & 1 & 0 & 0 \\
0 & 0 & 0 & 1 & 1 & 0 & 0 & 0 \\
0 & 0 & 0 & 1 & 0 & 0 & 0 & 0 \\
0 & 0 & 0 & 1 & 0 & 0 & 0 & 0 \\
0 & 0 & 0 & 0 & 0.5 & 1 & 0 & 0 \\
0 & 0 & 0 & 0 & 1 & 0 & 0 & 0 \\
0 & 0 & 0 & 0 & 1 & 0 & 0 & 0 \\
0 & 0 & 0 & 1 & 0.5 & 0 & 0 & 0 \\
0 & 0 & 0 & 0 & 1 & 0 & 0 & 0 \\
0 & 0 & 0 & 0 & 1 & 0 & 0 & 0
\end{bmatrix} \tag{2}$$

Figure 21:
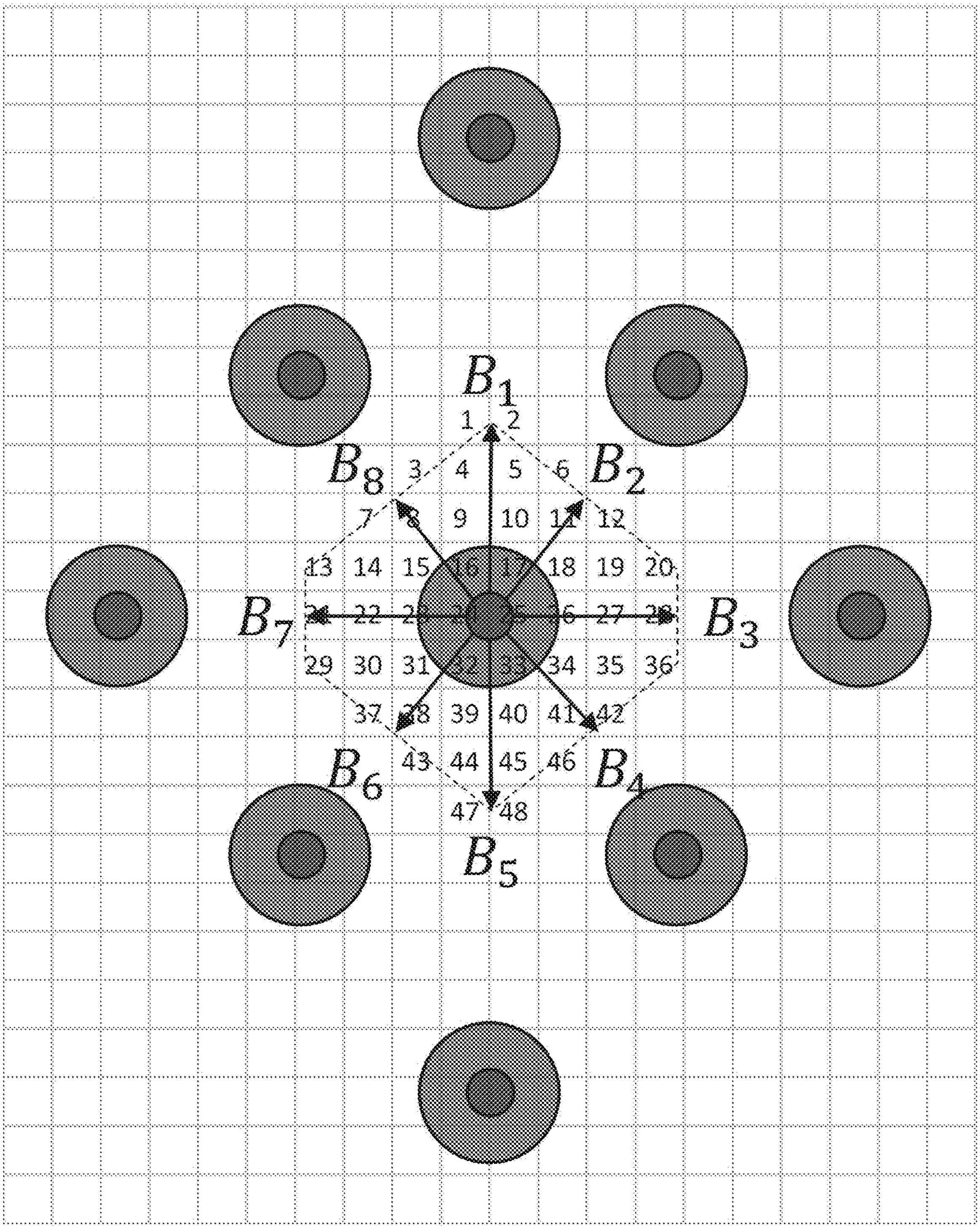
FIG. 21 is a view showing eight directions (the droplet shape at time 1) used for shape control of the droplet $D_0$.
Figure 22:
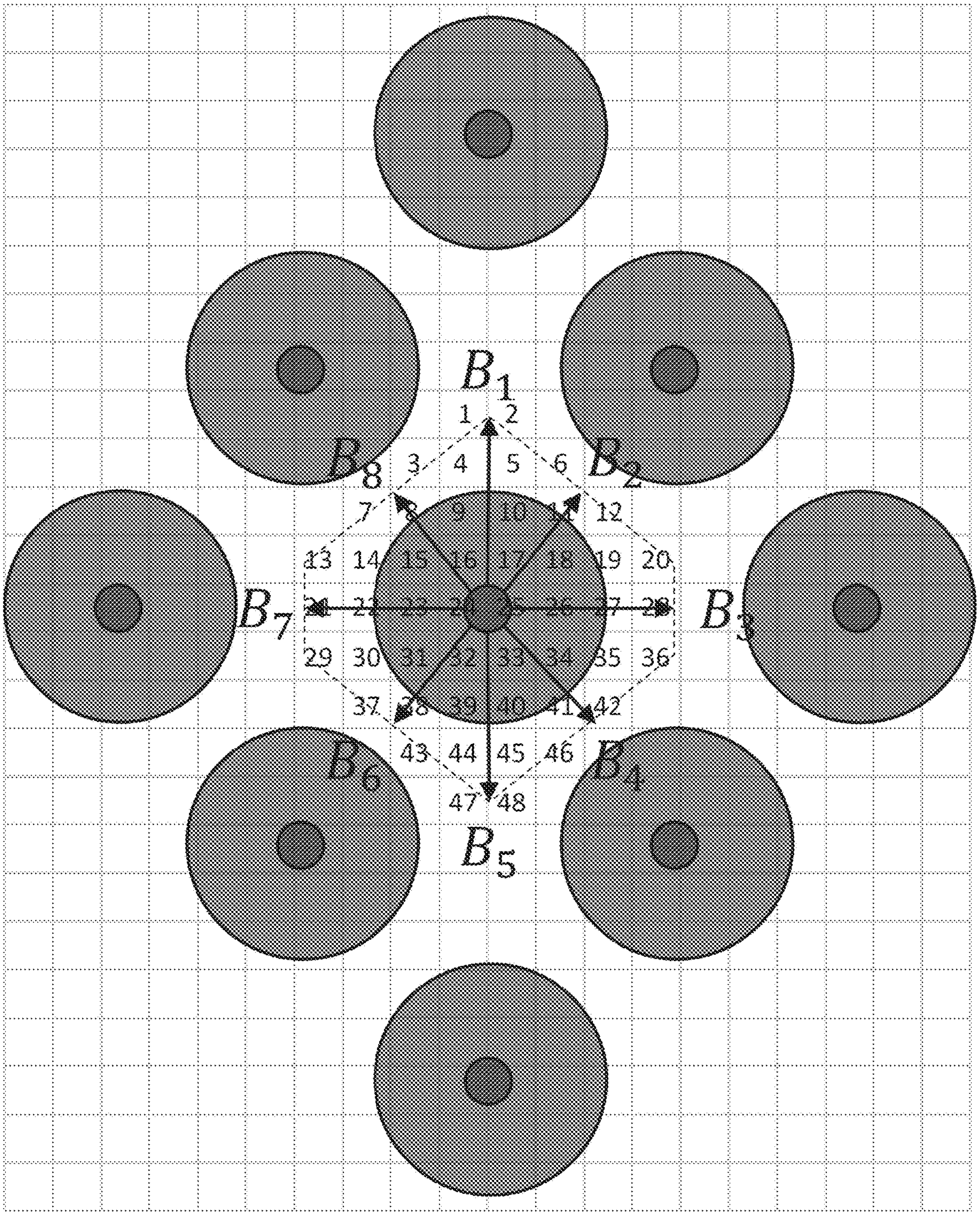
FIG. 22 is a view showing eight directions (the droplet shape at time 2) used for shape control of the droplet $D_0$.

Next, the change of the spread speed of the droplet (photo-curing composition) caused by irradiation of light by the light irradiator LI (DMD) will be described using the droplet $D_0$ as an example. FIG. 20 shows the state of the droplets at time 0, FIG. 21 shows the state of the droplets at time 1, and FIG. 22 shows the state of the droplets at time 2. At time 0 shown in FIG. 20, the droplets are still small, and it is difficult to control the directivity of the spread of the droplets by the DMD. Hence, control is performed such that each droplet naturally spreads in all directions by setting the illuminance of all pixels to zero. This is expressed by equations (3) and (4).

$$\begin{bmatrix} V_1(0) \\ V_2(0) \\ V_3(0) \\ V_4(0) \\ V_5(0) \\ V_6(0) \\ V_7(0) \\ V_8(0) \end{bmatrix} = \begin{bmatrix} V_1 \\ V_2 \\ V_3 \\ V_4 \\ V_5 \\ V_6 \\ V_7 \\ V_8 \end{bmatrix} \tag{3}$$

$$\begin{bmatrix} I_1(0) \\ I_2(0) \\ \vdots \\ I_{48}(0) \end{bmatrix} = \begin{bmatrix} 0 \\ 0 \\ \vdots \\ 0 \end{bmatrix} \tag{4}$$

At time 1 shown in FIG. 21 as well, control is performed such that each droplet naturally spreads in all directions by setting the illuminance of all pixels to zero. This is expressed by equations (5) and (6).

$$\begin{bmatrix} V_1(1) \\ V_2(1) \\ V_3(1) \\ V_4(1) \\ V_5(1) \\ V_6(1) \\ V_7(1) \\ V_8(1) \end{bmatrix} = \begin{bmatrix} V_1 \\ V_2 \\ V_3 \\ V_4 \\ V_5 \\ V_6 \\ V_7 \\ V_8 \end{bmatrix} \tag{5}$$

$$\begin{bmatrix} I_1(1) \\ I_2(1) \\ \vdots \\ I_{48}(1) \end{bmatrix} = \begin{bmatrix} 0 \\ 0 \\ \vdots \\ 0 \end{bmatrix} \tag{6}$$

At time 2 shown in FIG. 22, the DMD is controlled to cause the droplet of the target to finally obtain a hexagonal shape. For the directions $B_1$ and $B_5$, to make the spread speed slightly low, the speed is controlled to 0.9 times the speed at illuminance=0. For the directions $B_2$, $B_4$, $B_6$, and $B_8$, to make the spread speed remarkably low, the speed is controlled to 0.6 times the speed at illuminance=0. For the directions $B_3$ and $B_7$, the speed is controlled to 1 time the speed at illuminance=0, that is, control is performed such that the speed does not lower. These are expressed by equation (7).

$$\begin{bmatrix} V_1(2) \\ V_2(2) \\ V_3(2) \\ V_4(2) \\ V_5(2) \\ V_6(2) \\ V_7(2) \\ V_8(2) \end{bmatrix} = \begin{bmatrix} 0.9V_1 \\ 0.6V_2 \\ V_3 \\ 0.6V_4 \\ 0.9V_5 \\ 0.6V_6 \\ V_7 \\ 0.6V_8 \end{bmatrix} \tag{7}$$

Here, $R_i(2)$, that is, the area ratio of the photo-curing composition (droplet) in the region of the pixel i (DMD section) at time 2 is digitized. In FIG. 22, the pixels 1 to 7, 12, 13, 20, 21, 28, 29, 36, 37, and 42 to 48 have an area ratio of 0. The area ratios of the remaining pixels are indicated by equation (8). The viscosity of the photo-curing composition can locally be controlled only for a pixel on which the photo-curing composition exists. That is, in the state shown in FIG. 22, the spread speeds in the above-described eight directions are controlled by the illuminances of the 26 pixels shown by equation (8).

$$\begin{bmatrix} R_8(2) \\ R_9(2) \\ R_{10}(2) \\ R_{11}(2) \\ R_{14}(2) \\ R_{15}(2) \\ R_{16}(2) \\ R_{17}(2) \\ R_{18}(2) \\ R_{19}(2) \\ R_{22}(2) \\ R_{23}(2) \\ R_{24}(2) \\ R_{25}(2) \\ R_{26}(2) \\ R_{27}(2) \\ R_{30}(2) \\ R_{31}(2) \\ R_{32}(2) \\ R_{33}(2) \\ R_{34}(2) \\ R_{35}(2) \\ R_{38}(2) \\ R_{39}(2) \\ R_{40}(2) \\ R_{41}(2) \end{bmatrix} = \begin{bmatrix} 0.3 \\ 0.7 \\ 0.7 \\ 0.3 \\ 0.1 \\ 0.95 \\ 1 \\ 1 \\ 0.95 \\ 0.1 \\ 0.2 \\ 1 \\ 1 \\ 1 \\ 1 \\ 0.2 \\ 0.1 \\ 0.95 \\ 1 \\ 1 \\ 0.95 \\ 0.1 \\ 0.3 \\ 0.7 \\ 0.7 \\ 0.3 \end{bmatrix} \tag{8}$$

In the state shown in FIG. 22, that is, at time 2, spread speeds $V_n(2)$ of the photo-curing composition in the eight directions are decided by the known area ratio $R_i(2)$ of the 26 pixels, the known matrices $A_{i,n}$, and unknown illuminances $I_i(2)$, and are given by equations (9) and (10).

$$\begin{bmatrix} V_1(1) \\ V_2(2) \\ V_3(2) \\ V_4(2) \\ V_S(2) \\ V_6(2) \\ V_7(2) \\ V_8(2) \end{bmatrix} = \begin{bmatrix} V_1 \\ V_2 \\ V_3 \\ V_4 \\ V_5 \\ V_6 \\ V_7 \\ V_8 \end{bmatrix} \left( 1 - \begin{bmatrix} A_{8,n} \\ A_{9,n} \\ A_{10,n} \\ A_{11,n} \\ A_{14,n} \\ A_{15,n} \\ A_{16,n} \\ A_{17,n} \\ A_{18,n} \\ A_{19,n} \\ A_{22,n} \\ A_{23,n} \\ A_{24,n} \\ A_{25,n} \\ A_{26,n} \\ A_{27,n} \\ A_{30,n} \\ A_{31,n} \\ A_{32,n} \\ A_{33,n} \\ A_{34,n} \\ A_{35,n} \\ A_{38,n} \\ A_{39,n} \\ A_{40,n} \\ A_{41,n} \end{bmatrix}^T \begin{bmatrix} R_8(2)I_8(2) \\ R_9(2)I_9(2) \\ R_{10}(2)I_{10}(2) \\ R_{11}(2)I_{11}(2) \\ R_{14}(2)I_{14}(2) \\ R_{15}(2)I_{15}(2) \\ R_{16}(2)I_{16}(2) \\ R_{17}(2)I_{17}(2) \\ R_{18}(2)I_{18}(2) \\ R_{19}(2)I_{19}(2) \\ R_{22}(2)I_{22}(2) \\ R_{23}(2)I_{23}(2) \\ R_{24}(2)I_{24}(2) \\ R_{25}(2)I_{25}(2) \\ R_{26}(2)I_{26}(2) \\ R_{27}(2)I_{27}(2) \\ R_{30}(2)I_{30}(2) \\ R_{31}(2)I_{31}(2) \\ R_{32}(2)I_{32}(2) \\ R_{33}(2)I_{33}(2) \\ R_{34}(2)I_{34}(2) \\ R_{35}(2)I_{35}(2) \\ R_{38}(2)I_{38}(2) \\ R_{39}(2)I_{39}(2) \\ R_{40}(2)I_{40}(2) \\ R_{41}(2)I_{41}(2) \end{bmatrix} \right) \tag{9}$$

$$\begin{bmatrix} 0.1 \\ 0.4 \\ 0 \\ 0.4 \\ 0.1 \\ 0.4 \\ 0 \\ 0.4 \end{bmatrix} = \begin{bmatrix} A_{8,n} \\ A_{9,n} \\ A_{10,n} \\ A_{11,n} \\ A_{14,n} \\ A_{15,n} \\ A_{16,n} \\ A_{17,n} \\ A_{18,n} \\ A_{19,n} \\ A_{22,n} \\ A_{23,n} \\ A_{24,n} \\ A_{25,n} \\ A_{26,n} \\ A_{27,n} \\ A_{30,n} \\ A_{31,n} \\ A_{32,n} \\ A_{33,n} \\ A_{34,n} \\ A_{35,n} \\ A_{38,n} \\ A_{39,n} \\ A_{40,n} \\ A_{41,n} \end{bmatrix}^T \begin{bmatrix} R_8(2)I_8(2) \\ R_9(2)I_9(2) \\ R_{10}(2)I_{10}(2) \\ R_{11}(2)I_{11}(2) \\ R_{14}(2)I_{14}(2) \\ R_{15}(2)I_{15}(2) \\ R_{16}(2)I_{16}(2) \\ R_{17}(2)I_{17}(2) \\ R_{18}(2)I_{18}(2) \\ R_{19}(2)I_{19}(2) \\ R_{22}(2)I_{22}(2) \\ R_{23}(2)I_{23}(2) \\ R_{24}(2)I_{24}(2) \\ R_{25}(2)I_{25}(2) \\ R_{26}(2)I_{26}(2) \\ R_{27}(2)I_{27}(2) \\ R_{30}(2)I_{30}(2) \\ R_{31}(2)I_{31}(2) \\ R_{32}(2)I_{32}(2) \\ R_{33}(2)I_{33}(2) \\ R_{34}(2)I_{34}(2) \\ R_{35}(2)I_{35}(2) \\ R_{38}(2)I_{38}(2) \\ R_{39}(2)I_{39}(2) \\ R_{40}(2)I_{40}(2) \\ R_{41}(2)I_{41}(2) \end{bmatrix} \quad (10)$$

Figure 23:
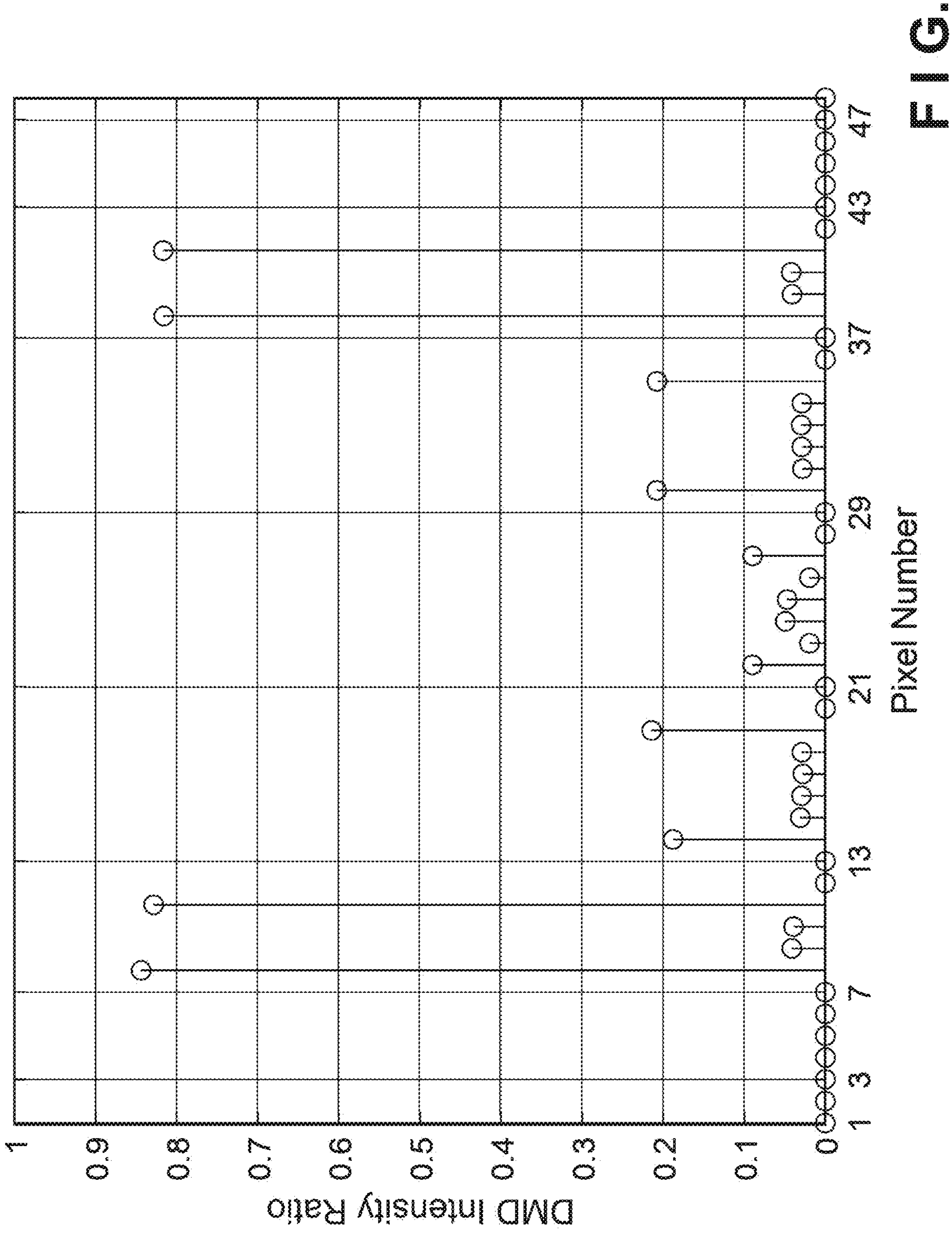
FIG. 23 is a view exemplarily showing the solution of optimizing, within the range of 0 to 1, the illuminance (intensity ratio) of each pixel (DMD section) controlled by DMD.
Figure 24:
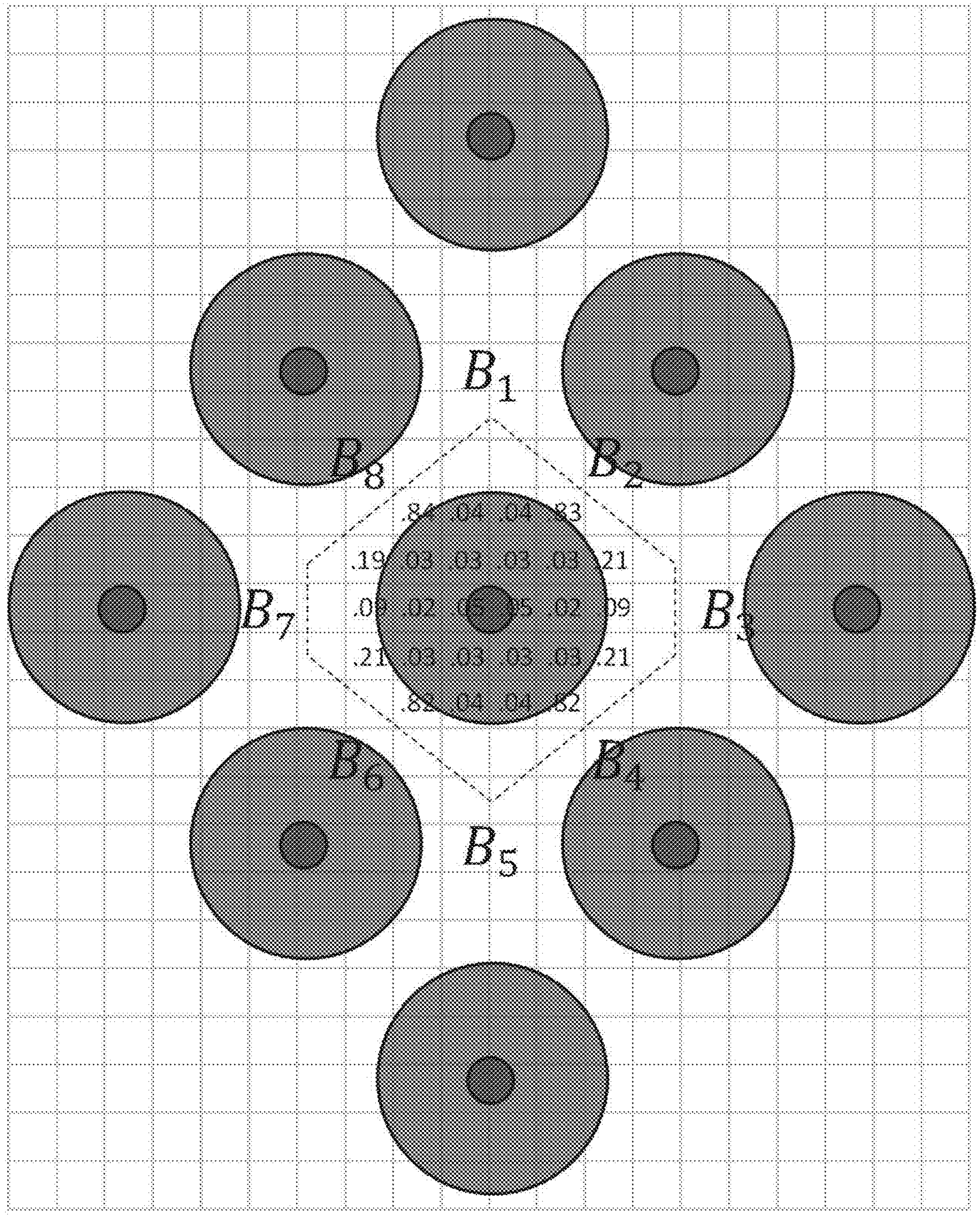
FIG. 24 is a view in which the optimum solution shown in FIG. 23 is added to the view of the arrangement of the plurality of droplets.

FIG. 23 shows a result of setting the illuminance $I_i(2)$ between 0 and 1 and obtaining, by optimization (steps S145 to S147), a combination in which values on both sides of equation (9) are closest. In FIG. 23, the abscissa represents the pixel number, and the ordinate represents the illuminance (DMD intensity ratio). FIG. 24 shows the illuminances in FIG. 23 described on the arrangement diagram of droplets. Pixel numbers in FIG. 24 are the same as in FIG. 19. In the result shown in FIG. 24, as for the illuminance controlled by the DMD, the pixels (pixels 8, 11, 38, and 41) located in the directions $B_2$, $B_4$, $B_6$, and $B_8$ in which spread should be suppressed have high illuminances (0.82 to 0.84).

Figure 25:
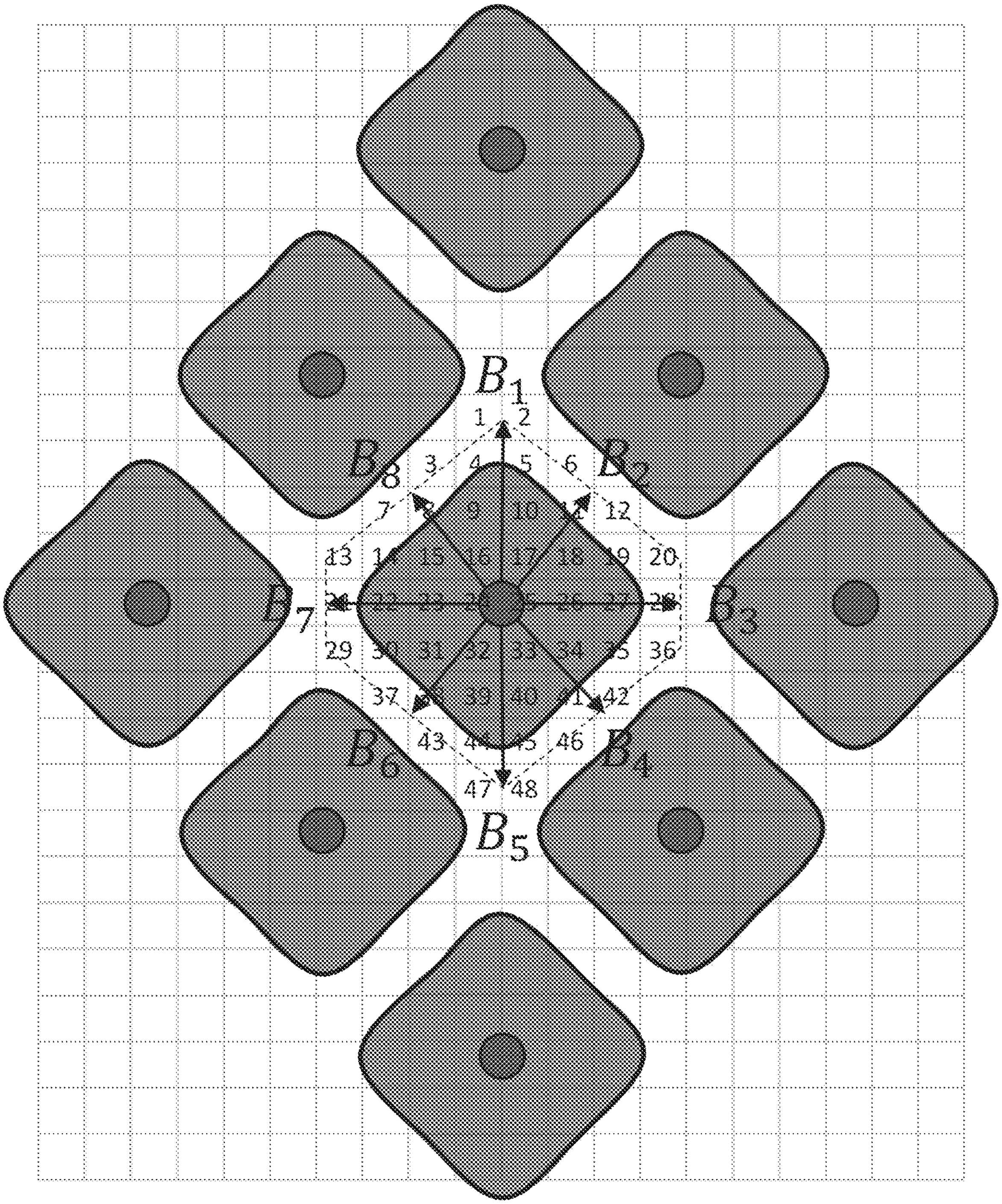
FIG. 25 is a view showing the shapes of the plurality of droplets at time 3.

FIG. 25 shows the shape of the droplets after controlled in accordance with the conditions shown in FIG. 24. As is apparent from this result, the droplet shape is close to the target hexagonal shape.

Example 2

In Example 1, control is performed by setting the initial value of the illuminance of light irradiated to a droplet via a DMD to zero and increasing the illuminance to suppress spread of the droplet, thereby making the droplet close to the target shape. On the other hand, in Example 2, the initial value of the illuminance of light irradiated to a droplet via a DMD is set to a predetermined illuminance other than 0, thereby improving the degree of freedom of optimization.

Figure 26:
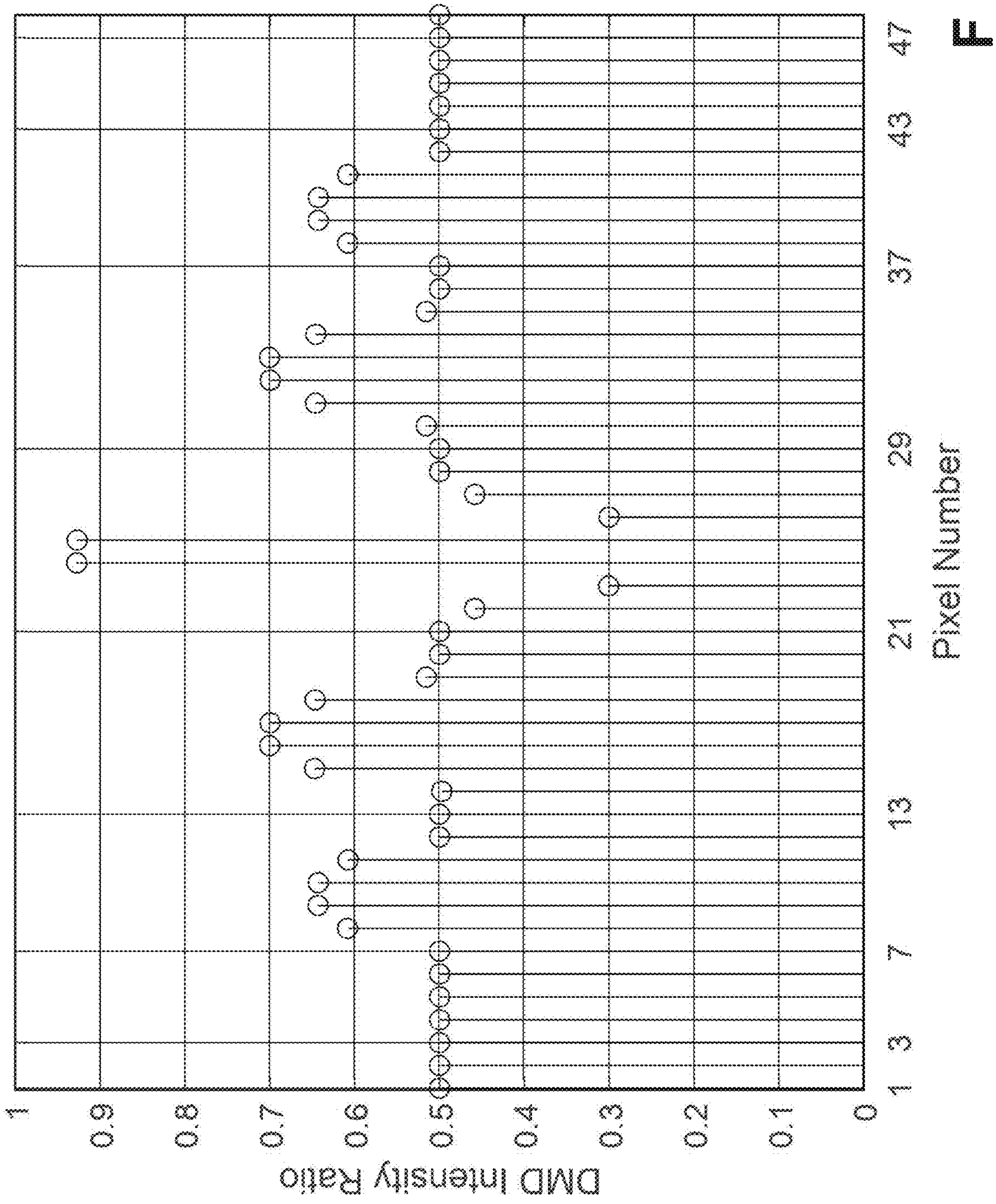
FIG. 26 is a view exemplarily showing the solution of optimizing, within the range of 0 to 1, the illuminance (intensity ratio) of each pixel (DMD section) controlled by DMD.

FIG. 26 shows an optimization result in a case where an initial value of illuminance (intensity ratio)=0.5 is evenly given to all pixels of the DMD. In this result, illuminances lower than the initial illuminance are set for pixels 22, 23, 26, and 27. This indicates that the spread speed of a droplet in directions $B_3$ and $B_7$ is optimized such that it is higher than the initial condition.

According to this example, the spread speed of a droplet is suppressed in advance by giving the initial illuminance by the DMD, and furthermore, the droplet can be controlled to a target shape by increasing/decreasing the illuminance. Hence, even under a condition that readily connects droplets to each other in a case where, for example, the droplets are arranged at a high density or the spread speed of droplets is high, the optimum condition of illuminance control by the DMD for controlling a droplet to a target shape can easily be calculated.

Example 3

A behavior that a droplet of a photo-curing composition arranged on a substrate spreads changes depending on operation conditions such as the surface states of the substrate and a mold, the characteristic of the photo-curing composition, the density of droplets, and a force/angle/timing of pressing the mold against the photo-curing composition in imprint, and prediction by a simulation is assumed to be difficult. In Example 3, an example in which the behavior of a droplet spreading is measured, and the optimum condition of control of DMD for controlling the droplet to a target shape is calculated based on the result will be described. A camera 109 is used to measure the behavior of the droplet spreading.

Figure 27:
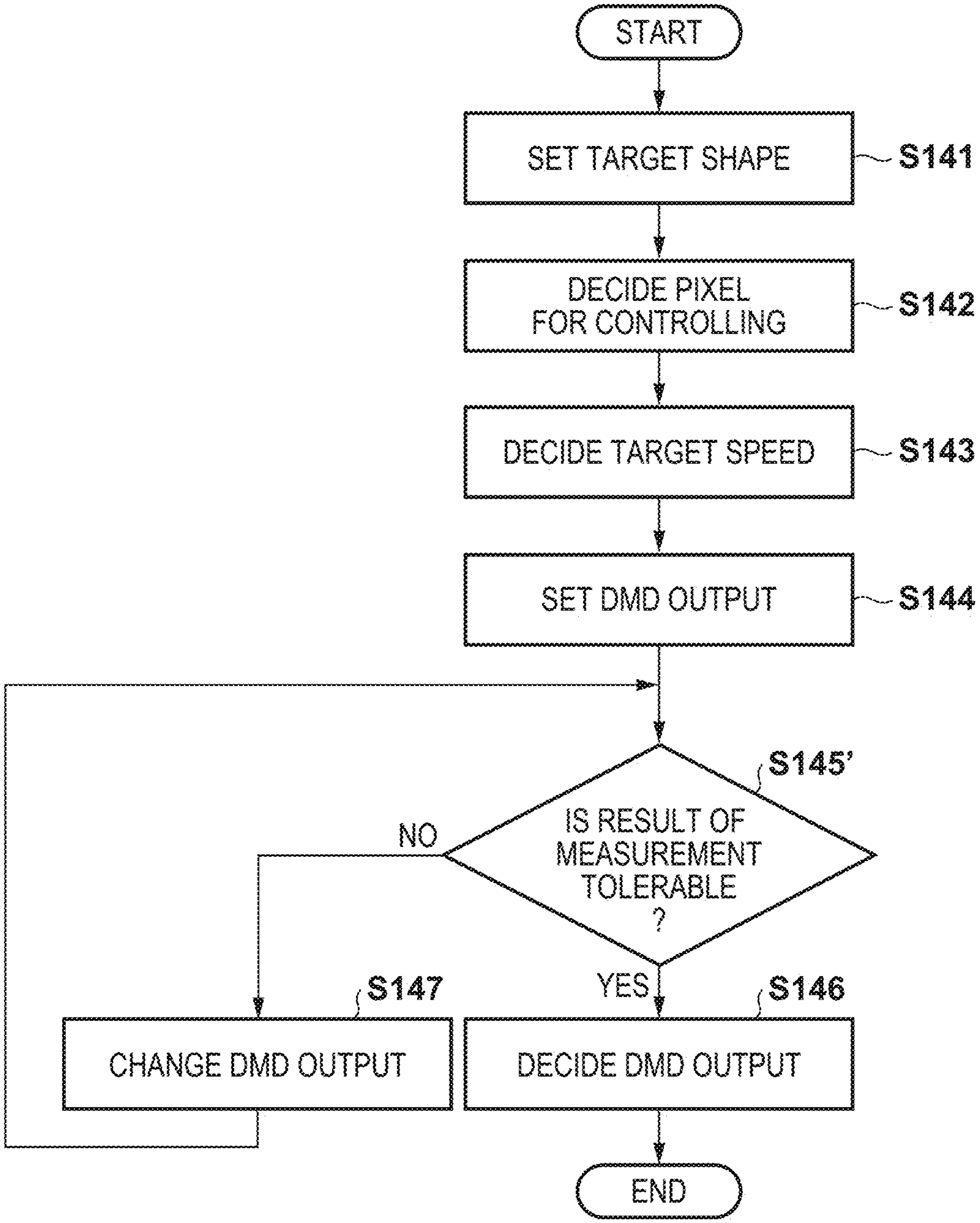
FIG. 27 is a flowchart exemplarily showing the procedure of an information processing method for generating control information for controlling spread of a plurality of droplets of a photo-curing composition arranged between a substrate and a mold.

FIG. 27 exemplarily shows a method of generating control information for controlling spread of a plurality of droplets of a photo-curing composition arranged between a substrate and a mold in Example 3. In the method shown in FIG. 24, step S145 in the method shown in FIG. 14 is replaced with step S145'. In step S145', the shape of a droplet is measured using the camera 109, and it is determined whether the target speed decided in step S143 is achieved by the DMD output set or changed in step S144 (step S147 if step S145 is executed next to step S147). The method shown in FIG. 27 may be executed in real time while measuring the shape of the droplet by the camera 109 in step S145', or a step of creating a sample for measuring the droplet shape under the condition to set the output of the DMD, performing measurement offline, and readjusting the output of the DMD based on the result may repetitively be executed. Regions to be captured by the camera 109 need not be all droplets, and a specific region serving as the reference of optimization may be set.

When the directivity of spread of each droplet is controlled based on the actually measured behavior of droplets spreading, like Example 3, the spread of a droplet can be controlled to the target shape even under a condition difficult for prediction.

Application Example

An article manufacturing method according an embodiment can include a step of forming a cured film on a substrate by the above-described film forming apparatus or film forming method, and a step of processing the substrate on which the cured film is formed, thereby obtaining an article. If the film forming apparatus is an imprint apparatus, a mold including a pattern is used, and the pattern can be transferred to the cured film.

The pattern of a cured product formed using the film forming apparatus or the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the optical element include a microlens, a light guide, a waveguide, an antireflection film, a diffraction grating, a polarizing element, a color filter, a light emitting element, a display, and a solar cell. Examples of the MEMS include a DMD, a microchannel, and an electromechanical conversion element. Examples of the recording element include an optical disk such as a CD or a DVD, a magnetic disk, a magneto-optical disk, and a magnetic head. Examples of the sensor include a magnetic sensor, an optical sensor, and a gyro sensor. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 28A:
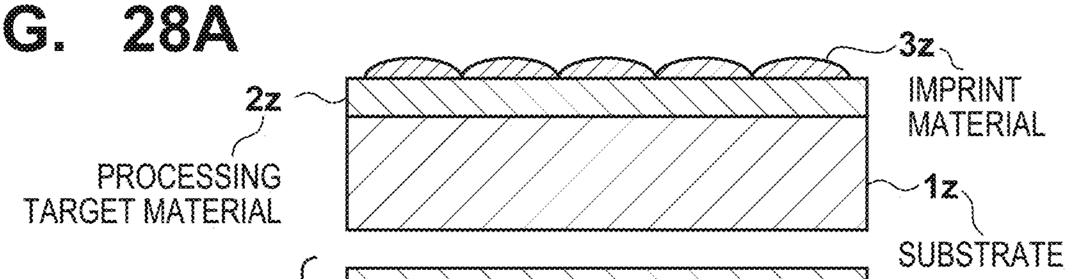
FIGS. 28A to 28F are views exemplarily showing an article manufacturing method.

An article manufacturing method in which a film forming apparatus or an imprint apparatus forms a pattern on a substrate, processes the substrate on which the pattern is formed, and manufactures an article from the processed substrate will be described next. As shown FIG. 28A, a substrate 1*z* such as a silicon wafer with a processed material 2*z* such as an insulator formed on the surface is prepared. Next, an imprint material 3*z* is applied to the surface of the processed material 2*z* by an inkjet method or the like. A state in which the imprint material 3*z* is applied as a plurality of droplets onto the substrate is shown here.

Figure 28B:
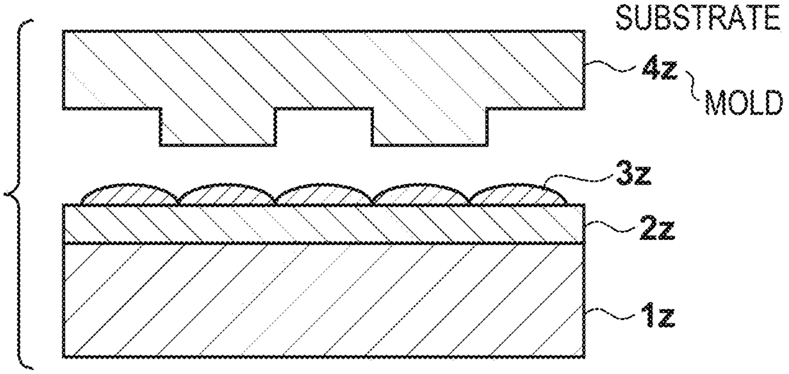
Figure 28C:
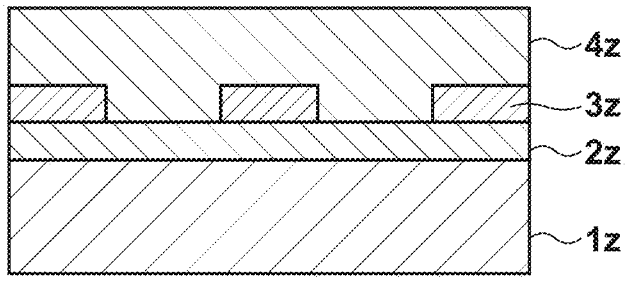

As shown in FIG. 28B, a side of a mold 4*z* for imprint with a concave-convex pattern is directed toward and made to face the imprint material 3*z* on the substrate. As shown in FIG. 28C, the substrate 1 to which the imprint material 3*z* is applied is brought into contact with the mold 4*z*, and a pressure is applied. The gap between the mold 4*z* and the processed material 2*z* is filled with the imprint material 3*z*. In this state, when the imprint material 3*z* is irradiated with light as energy for curing via the mold 4*z*, the imprint material 3*z* is cured.

Figure 28D:
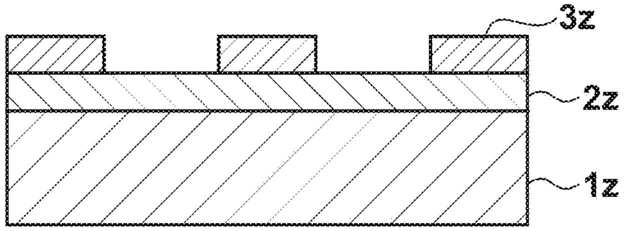

As shown in FIG. 28D, after the imprint material 3*z* is cured, the mold 4*z* is separated from the substrate 1*z*, and the pattern of the cured product of the imprint material 3*z* is formed on the substrate 1*z*. In the pattern of the cured product, the concave portion of the mold corresponds to the convex portion of the cured product, and the convex portion of the mold corresponds to the concave portion of the cured product. That is, the concave-convex pattern of the mold 4*z* is transferred to the imprint material 3*z*.

Figure 28E:
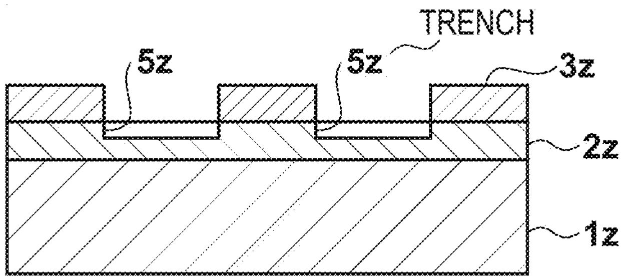
Figure 28F:
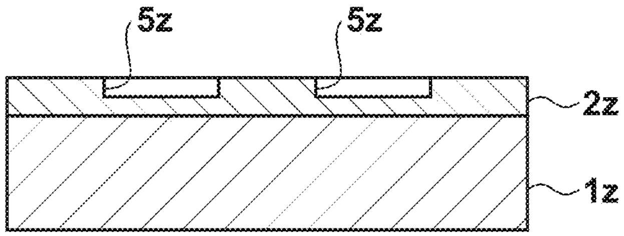

As shown in FIG. 28E, when etching is performed using the pattern of the cured product as an etching resistant mask, a portion of the surface of the processed material 2*z* where the cured product does not exist or remains thin is removed to form a groove 5*z*. As shown in FIG. 28F, when the pattern of the cured product is removed, an article with the grooves 5*z* formed in the surface of the processed material 2*z* can be obtained. Here, the pattern of the cured product is removed. However, instead of removing the pattern of the cured product after the process, it may be used as, for example, an interlayer dielectric film included in a semiconductor element or the like, that is, a constituent member of an article.

Figure 29A:
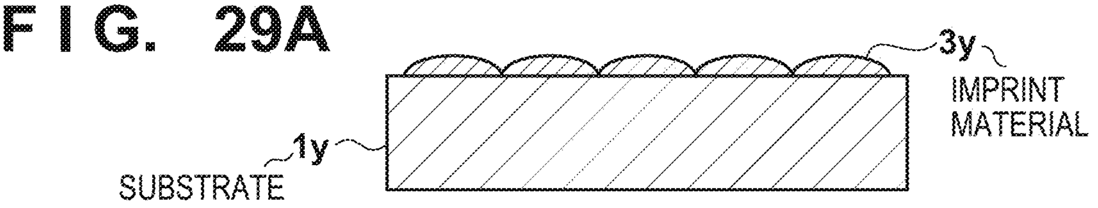
FIGS. 29A to 29D are views exemplarily showing an article manufacturing method.

Another article manufacturing method will be described next. As shown FIG. 29A, a substrate 1*y* such as silica glass is prepared. Next, an imprint material 3*y* is applied to the surface of the substrate 1*y* by an inkjet method or the like. A layer of another material such as a metal or a metal compound may be provided on the surface of the substrate 1*y*.

Figure 29B:
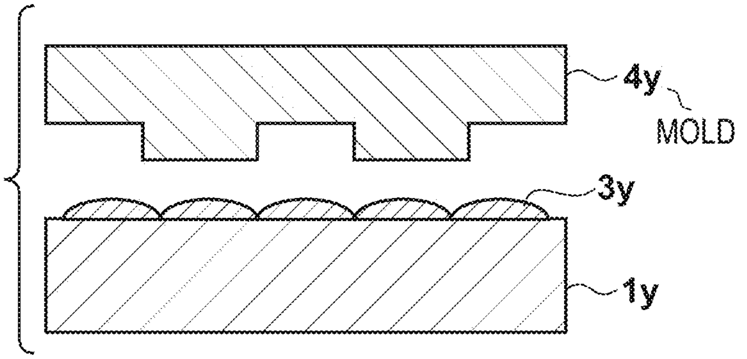
Figure 29C:
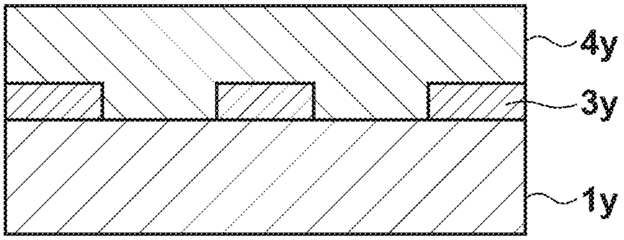

As shown in FIG. 29B, a side of a mold 4*y* for imprint with a concave-convex pattern is directed toward and made to face the imprint material 3*y* on the substrate. As shown in FIG. 29C, the substrate 1*y* to which the imprint material 3*y* is applied is brought into contact with the mold 4*y*, and a pressure is applied. The gap between the mold 4*y* and the substrate 1*y* is filled with the imprint material 3*y*. In this state, when the imprint material 3 is irradiated with light via the mold 4*y*, the imprint material 3 is cured.

Figure 29D:
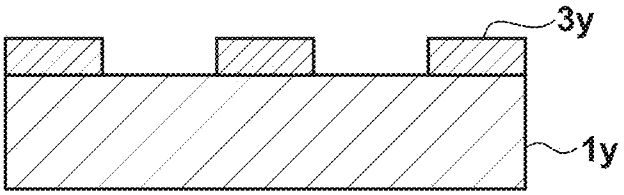

As shown in FIG. 29D, after the imprint material 3*y* is cured, the mold 4*y* is separated from the substrate 1*y*, and the pattern of the cured product of the imprint material 3*y* is formed on the substrate 1*y*. Thus, an article including the pattern of the cured product as a constituent member can be obtained. Note that when the substrate 1*y* is etched using the pattern of the cured product as a mask in the state shown in FIG. 29D, an article with the concave and convex portions reversed with respect to the mold 4*y*, for example, an imprint mold can be obtained.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-013283, filed Jan. 31, 2023, which is hereby incorporated by reference herein in its entirety.

What is claimed is:

1. A film forming method for forming a cured film, comprising:

bringing a plurality of separate droplets of a photo-curing composition arranged on a substrate into contact with a mold and curing a liquid film formed by connection of the plurality of separate droplets; and controlling spread of the plurality of separate droplets while controlling an optical modulation device configured to control a spatial illuminance distribution of light to be irradiated to the plurality of separate droplets, wherein in the controlling the spread, the optical modulation device is controlled such that a shape change of each of the plurality of separate droplets before the separate droplets adjacent to each other among the plurality of separate droplets are connected to each other to form the liquid film satisfies a target condition.

2. The method according to claim 1, wherein a plurality of pixels among all pixels of the optical modulation device are assigned to regions in which the plurality of separate droplets spread.

3. The method according to claim 2, wherein the plurality of pixels are at least nine pixels.

4. The method according to claim 1, wherein the mold includes a pattern, and the pattern is transferred to the cured film.

5. The method according to claim 1, wherein the controlling the optical modulation device includes the spatial illuminance distribution of light to be irradiated to each of the plurality of separate droplets.

6. The method according to claim 1, wherein the controlling the optical modulation device includes the spatial illuminance distribution of light to be irradiated to each of the plurality of separate droplets at each of a plurality of times.

7. The method according to claim 1, wherein the controlling the optical modulation device includes controlling at least one of an irradiation position, an illuminance, an irradiation timing, an irradiation period, and a focal depth of light irradiated, via the optical modulation device, to a space between the substrate and the mold.

8. An article manufacturing method comprising:

forming a cured film on a substrate by a film forming method defined in claim 1; and processing the substrate on which the cured film is formed, thereby obtaining an article.

* * * * *